Parikh et al.

United States Patent [19]

[11] 4,168,469
[45] Sep. 18, 1979

[54] DIGITAL DATA COMMUNICATION ADAPTER

[75] Inventors: Bipin D. Parikh; Haresh C. Patnaik; Bhagubhai K. Patel, all of Cambridge, Ohio; Prabodh M. Dharia, Des Plaines, Ill.; John J. Kurtz, Cambridge, Ohio; Alfred D. Jenkins, Cambridge, Ohio; Prakash Y. Mahajan, Cambridge, Ohio

[73] Assignee: NCR Corporation, Dayton, Ohio

[21] Appl. No.: 839,548

[22] Filed: Oct. 4, 1977

[51] Int. Cl.$^2$ ............................................. H04J 3/12
[52] U.S. Cl. ................................. 325/38 R; 364/900; 179/15 A
[58] Field of Search ........... 179/15 R, 15 BA, 15 AL, 179/15 BV, 15 AP, 15 A, 2 DP; 178/50, 58; 340/147 C, 147 PC, 147 MD, 146.1 R; 364/200, 900

[56] References Cited

U.S. PATENT DOCUMENTS

| | | | |
|---|---|---|---|
| 3,680,057 | 7/1972 | Blessin et al. | 364/200 |
| 3,710,027 | 1/1973 | Herter et al. | 179/15 BS |
| 4,011,412 | 3/1977 | Mattern | 179/15 BA |

*Primary Examiner*—Benedict V. Safourek
*Attorney, Agent, or Firm*—J. T. Cavender; Edward Dugas; Stephen F. Jewett

[57] ABSTRACT

Communications between processor terminals are carried out through the use of communication adapters. Each adapter receives selected control signals for transmitting or receiving data over a serial communication link to or from a remote terminal. The transmission portion of an adapter includes pretransmission control circuitry which receives control signals and stores transmission control signals which are used to control the format and serial transmission of a frame of data to a remote terminal. Each frame of data is begun and terminated with a uniquely encoded flag byte. Following the first flag byte are successive address and control fields. An optional information field may follow the control field and may include encoded information designating a dynamic change in the byte size of the data. Immediately following the information field, a frame check sequence field, generated in accordance with the contents of each of the address, control, and information field, is transmitted, followed by a frame terminating flag byte.

In order to enable the adapter to receive a serial data stream from a remote terminal and couple this received data to its assoicated processor, the adpater includes pre-reception control and direct memory access control circuitry coupled over the common control bus to the common control module and its associated memory.

Upon completely disassembling a frame, the adapter generates appropriate status signals and an interrupt is supplied to the common control.

21 Claims, 12 Drawing Figures

TRANSMITTER

RECEIVER

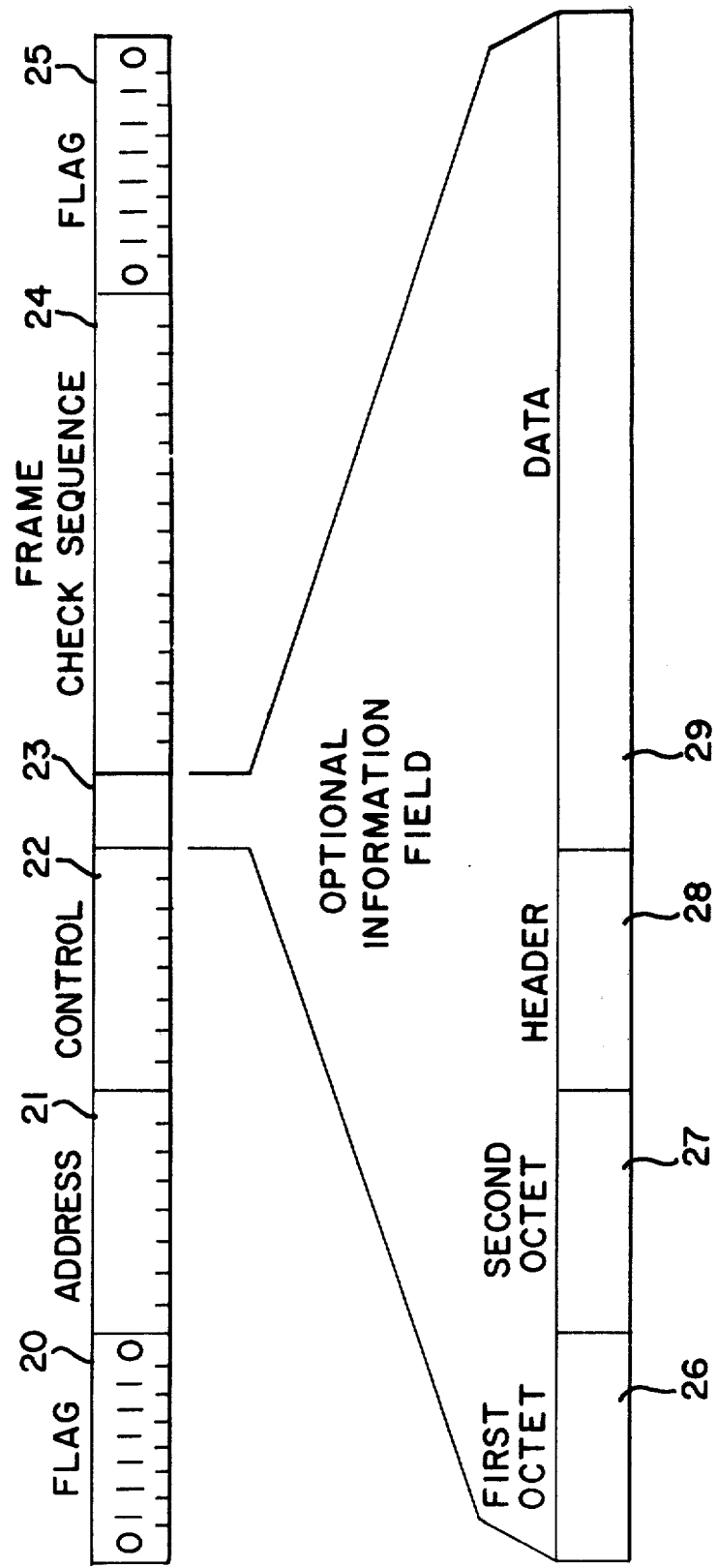

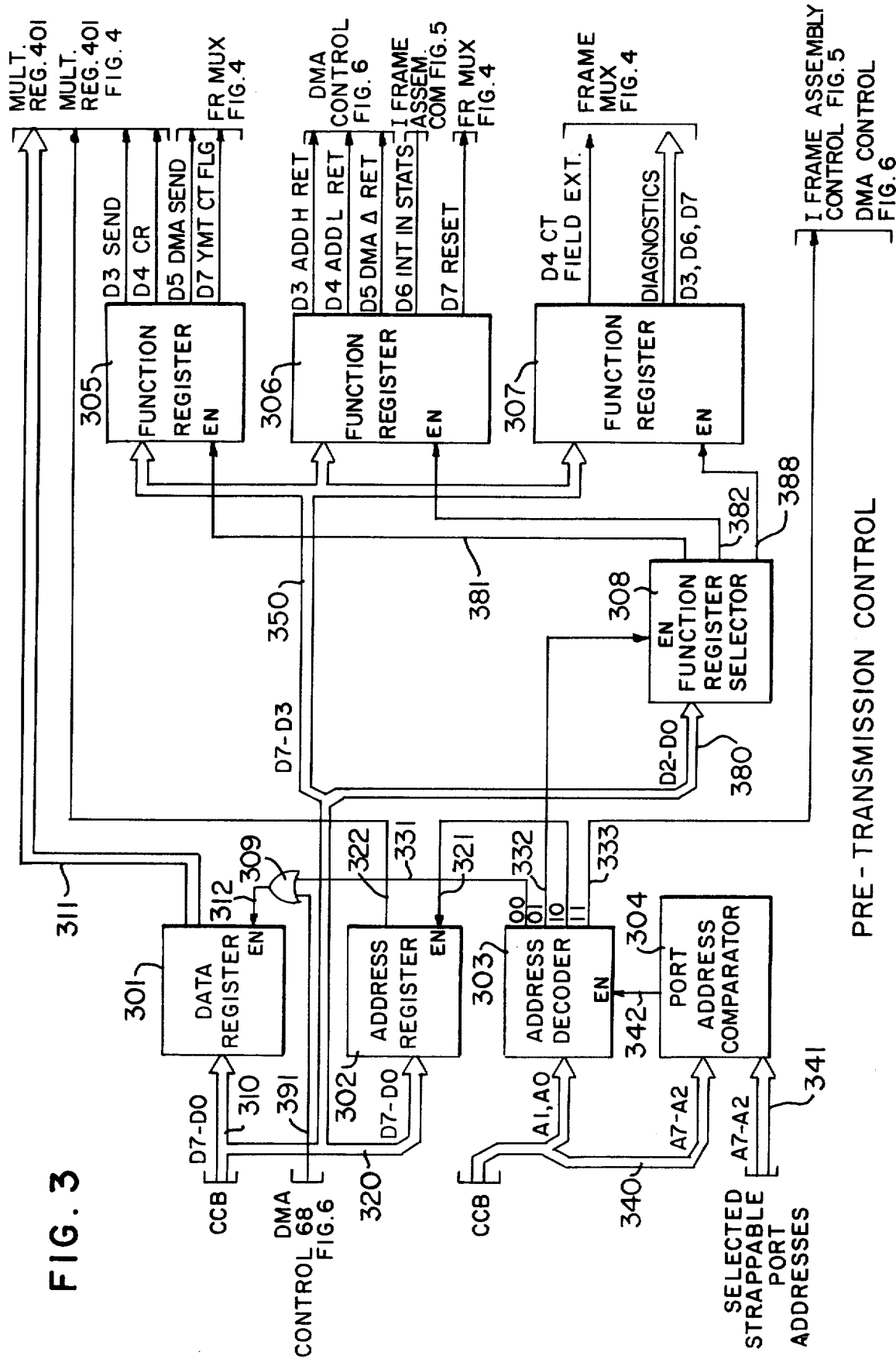

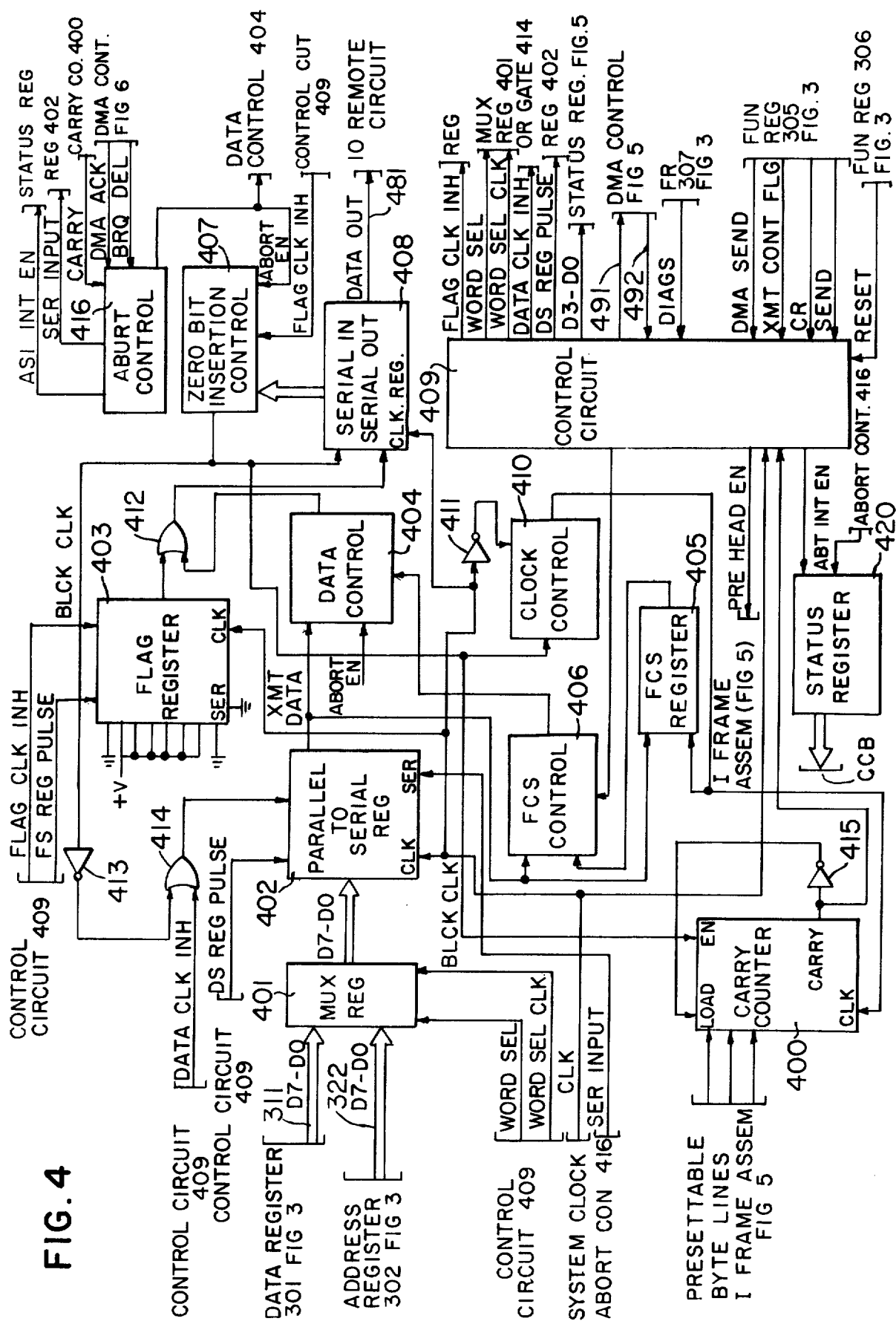

FIG. 6 DMA CONTROL

DIGITAL DATA COMMUNICATION ADAPTER

FIELD OF THE INVENTION

This invention relates to digital data communications, and particularly to the transmission and reception of data using a Synchronous Data Link Control format.

BACKGROUND OF THE INVENTION

When digital data is transmitted from one location to another over a communications channel, it is necessary for both the transmitting and receiving stations to operate according to an established message format. The message format is a function of many factors including data rate, expected error rate and error checking, word size of the data, type of communications channel and configuration of the network used. In actual practice it is desirable to utilize a widely accepted standard format, if possible, in order to enable communications with a large number of terminals and to reduce the time which would be required to develop a new format.

One of the new and widely accepted data communication formats, or protocols as they are often called, is Synchronous Data Link Control (SDLC). SDLC allows a great deal of flexibility in message protocol with respect to previously used protocols, such as Binary Synchronous Communication (BSC). SDLC is a bit oriented protocol in which any size data word may be transmitted, whereas BSC is byte oriented, requiring data to be transmitted in multiples of eight bits; also, SDLC has very flexible provisions for message switching and error control.

Prior data communication control equipment has been inflexible because of the inflexible protocols used. A data communications adapter can be built for SDLC using the same inflexible techniques as previously used if only one particular use of SDLC is considered; however, there is now a need for a flexible data communication control arrangement which is capable of taking advantage of all the features of SDLC which might be used in the future.

The present invention results in a very flexible data communications adapter which may be programmed by the Common Control processor to which it is connected, thereby affording a large number of the available variations of SDLC formats. The invention is very efficient in that it operates independently once it has been initialized, transmitting or receiving a bit serial data stream according to the specified format. During both transmission and reception, data coupling with the process takes place using Direct Memory Access (DMA).

SUMMARY OF THE INVENTION

In accordance with the present invention, communication between processor terminals is carried out through the use of communication adapters. Each adapter is coupled to an associated processor and memory over a unibus structure and receives from the common control selected control signals for transmitting or receiving data over a serial communication link to or from a remote adapter and its own associated processor and memory. The transmission portion of the data communications adapter includes pre-transmission control and direct memory access control circuitry coupled over a common control bus to a common control module and associated memory. The pretransmission control circuitry receives initial control signals from the common control and, in response to these initial control signals, stores prescribed transmission control signals which are employed to control the format and serial transmission of a frame of data to a remote terminal. The format of the data frame depends upon whether or not an information field is to be transmitted. When an information field is to be included in the frame, the pretransmission control circuitry selectively activates information field assembly control circuitry, so that the data will be assembled and transmitted according to the proper format. Each frame of data is begun and terminated with a uniquely encoded flag byte. Following the first flag byte are successive address and control fields. An information field may follow the control field and may include first and second preheader bytes followed by a header field and then data. A dynamic change in the byte size of the data is effected by encoding the first preheater byte to designate the occurrence of and the magnitude of the change in byte size. The second preheater byte defines the number of data bytes to be transmitted before the byte size change designated in the first preheader byte is to occur. Immediately following the information field, a frame check sequence field, generated in accordance with the contents of each of the address, control and information field, is transmitted, followed by a frame terminating flag byte.

Since the flag bytes define the end boundaries of the frame, circuitry is provided to prevent the generation and transmission of a series of data bits which are the same as the code of the flag byte. Specifically, a zero bit insertion circuit monitors the frame as it is serially transmitted to the remote terminal and, upon detecting a preselected code, alters the data stream by inserting a dummy zero bit which is to be deleted at the receiver, thereby preventing an erroneous transmission of a flag byte. The zero bit insertion circuit is normally enabled except during the transmission of the flag byte and during the transmission of an abort character. (An abort character is defined by a series of eight consecutive one bits, the insertion of a zero bit into which would prevent the transmission and detection of an abort). A complete frame of data is assembled and transmitted by selective control of frame multiplexer and transmission circuitry which is coupled to the pretransmission control, direct memory access control and information field assembly control circuitry. Upon completion of transmission of a frame, appropriate status signals are generated and interrupt is delivered to the common control.

In order to enable the adapter to receive a serial data stream from a remote terminal and couple this received data to its associated processor, the adapter includes pre-reception control and direct memory access control circuitry coupled over the common control bus to the common control module and its associated memory. Like the transmitter section of the adapter, the receiver circuitry receives initializing control signals from the common control and stores prescribed reception control signals which are employed to control the recognition and byte separation of a frame of data transmitted from a remote terminal. Once initialized, the adapter receiver circuitry monitors the incoming data line. When the adapter recognizes that a frame of data is being sent to it, it proceeds to disassemble the frame and forward the data bytes to the processor memory via direct memory access control. For this purpose, the receiver portion of the adapter includes flag detection circuitry, an address comparator, and dynamic byte size change control circuit which controls the coupling of the received data into memory. The address comparator compares the address code contained within the address byte with the port address programmed into the adapter in accordance with its intended use. The port address may be unique to the adapter, so that only one particular adapter will monitor and receive the transmitted data stream, or it may be a multi-adapter address. Provision is made for each adapter to be a member of classes or groups of adapters, so that each adapter of a particular group will monitor and receive a transmitted frame, the address field of which identifies that particular group. An additional address which may be used by the system is a global address to which each adapter connected in the system responds.

In the course of receiving data, each adapter employs zero deletion circuitry which monitors the received serial data stream and removes any dummy zero bits inserted at the transmitter to avoid erroneous flag byte recognition. The receiver also includes an abort character recognition circuit which terminates the frame upon detection of seven consecutive one bits.

Upon disassembling or demultiplexing a frame of data and recognizing a terminating flag byte, the adapter compares the transmitted frame check sequence field with a frame check sequence character separately generated and stored during the serial reception of the data. As an additional diagnostic check, the adapter counts the data bits as they are received. Since the minimum contents of a frame (excluding initial flag and address byte) comprise an eight bit control byte, a sixteen bit FCS field and a closing or terminating flag byte for a total of thirty-two bits, once the adapter recognizes its address and begins receiving data, it knows that it should receive at least thirty-two bits. If closing flag is detected before a thirty two bit counter reaches a carry, an error condition is generated.

Upon completely disassembling a frame, the adapter generates appropriate status signals and an interrupt is supplied to the common control.

BRIEF DESCRIPTION OF THE DRAWINGS

The data communications adapter according to the present invention will be better understood from a consideration of the following accompanying drawings in which:

FIG. 2 shows the format of a typical SDLC frame;

FIG. 3 illustrates the details of a pretransmission control circuit;

FIG. 4 shows the details of a frame multiplexer and transmitter;

DETAILED DESCRIPTION

Transmitter Configuration

Figure 1A:
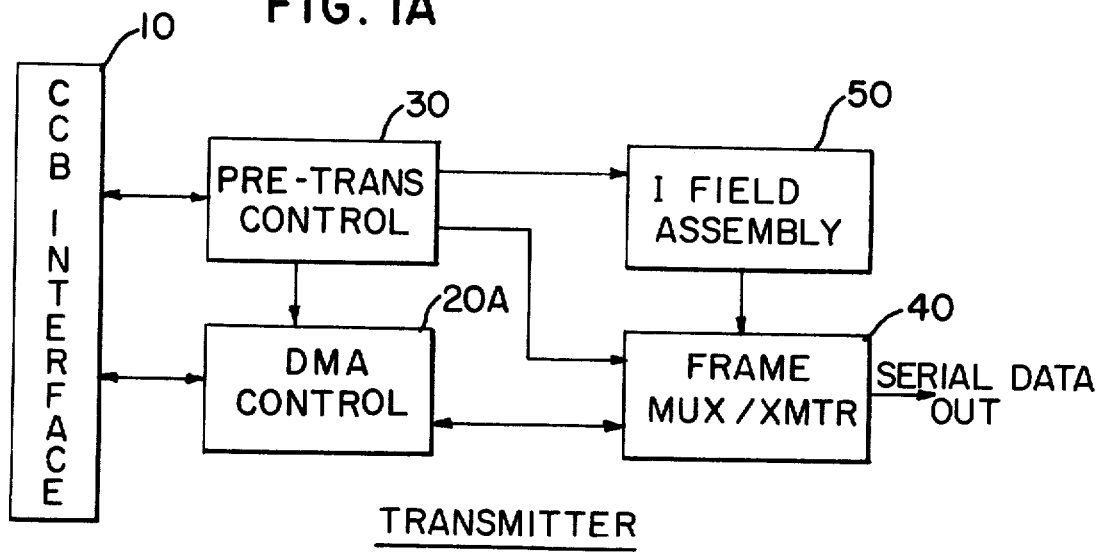
FIGS. 1A and 1B dipict the transmitter and receiver configurations, respectively, of a data communications adapter according to the invention in block diagram form.

Shown in FIG. 1A is a block diagram of the basic configuration of the transmitter section of a data communications adapter in accordance with the present invention. The adapter itself is coupled to associated common control processor and memory by way of the usual unified bus structure, including address, data, and control lines. Typically, the bus is a thirty-two bit structure having eight control, eight data and sixteen address bits. The bus coupling is represented by common control bus interface 10, which may include standard tri-state driver coupling circuitry, which couples signals between the terminal processor, memory, and the communication adapter components.

Included among these components is a pretransmission control circuit 30, the details of which will be described below with reference to FIG. 3. Pretransmission control circuit 30 is essentially comprised of decoding and latching circuitry which responds to transmission initializing control signals from the common control and stores data assembly and transmission signals to be employed by DMA control 20A, I field assembly 50, and frame multiplexer 40 for correctly assembling a frame of data and transmitting the frame to a remote terminal with which the common control module desires to communicate.

I field assembly control circuit 50, the details of which will be described below in conjunction with FIG. 5, responds to command signals stored in pretransmission control circuit 30, and causes the proper assembly of an information (I) field of data to be transmitted. The data itself is read out of memory by DMA control circuit 20A, the details of which will be described below in connection with FIG. 6, which selectively and sequentially addresses the computer memory via the sixteen address bits of the common control bus and causes the data stored in the memory to be coupled over the eight data bits to frame multiplexer circuit 40 for transmission to the addressed remote terminal.

Frame multiplexer 40, the details of which will be described below in conjunction with FIG. 4, responds to control signals supplied from pretransmission control circuit 30, DMA control circuit 20A, and I field assembly control circuit 50, and sequentially transmits the constituent components of a data frame to the remote terminal.

Frame Format (FIG. 2)

The order in which the data frame components are multiplexed for transmission by frame multiplexer 40 is depicted in FIG. 2. Each frame is begun and terminated with eight bit flag bytes 20 and 25, respectively, each having a unique code such as 0111 1110. Following the first flag byte 20 is an eight bit address byte 21 which identifies the address of the remote terminal to which the communication is directed. The address field 21 is followed by a control byte 22 (usually eight bits, although extendable) containing prescribed control information. Now, depending upon the mode of operation, the frame may next include an optional information field 23 containing data which is retrieved from memory by DMA control, transmitted to the remote terminal, and then loaded in memory at the remote terminal, by its own DMA control. If no information field is to be transmitted, the control byte is immediately followed by a frame check sequence field 24 and then a terminating flag byte 25. The frame check sequence (FCS) field 24 is a sixteen bit cyclic redundancy check polynominal for verifying the correctness of the frame of data at the remote terminal. The flag and FCS fields are generated in the multiplexer 40 itself and selectively transmitted with the remainder of the frame.

In addition to the data, the information field includes a first eight bit pre-header byte 26 (first octet) which may be followed by a second eight bit pre-header byte 27 (second octet), a header field 28 and then data 29. The pre-header bytes may contain information as to the size of the data to be transmitted and the occurrence of changes in byte size, so that the adapter can accommodate variations in byte length. The particular format of these pre-header bytes and their function within the information field will be explained in detail in connection with the description of the I field assembly control circuit 50.

Pre-transmission Control (FIG. 3)

Figure 8:
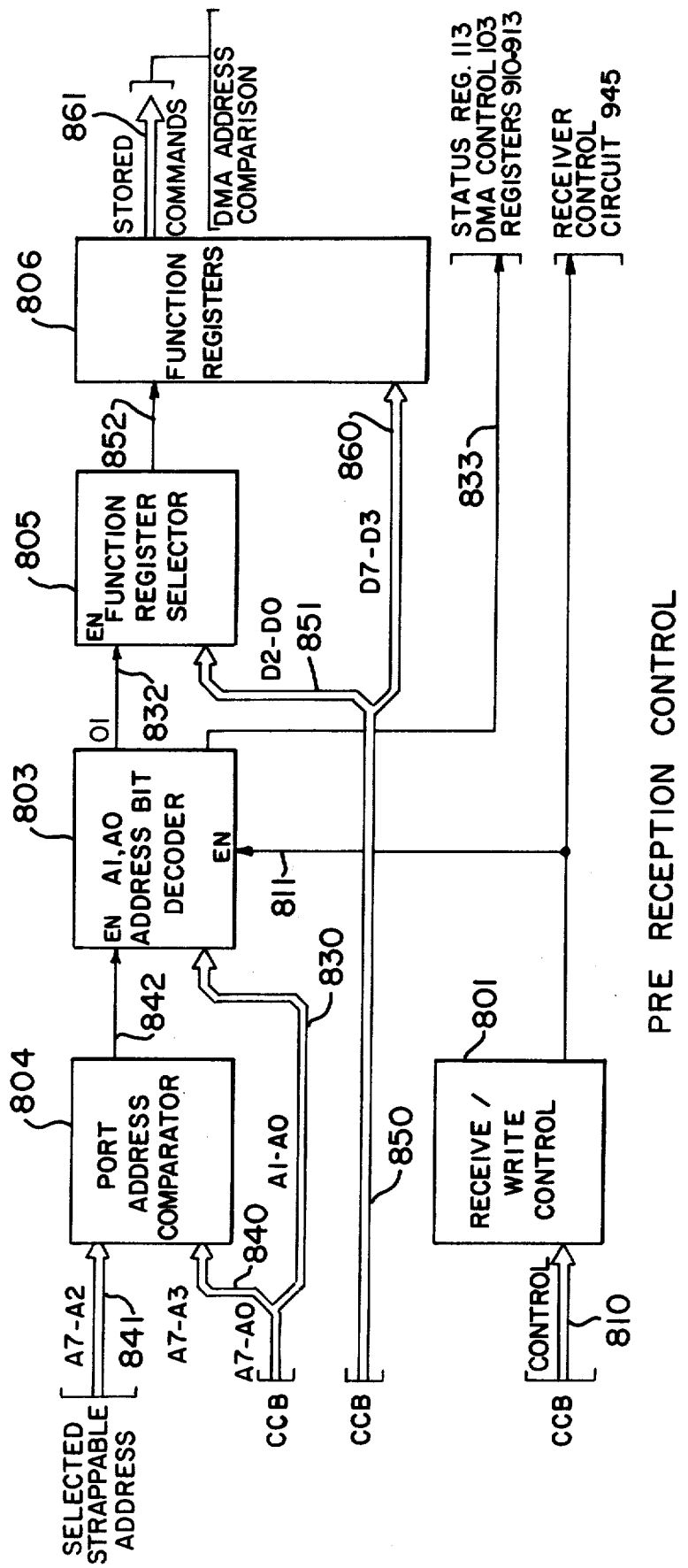
FIG. 8 is a block diagram depicting the details of a pre-reception control circuit.

As was described above, the pre-transmission control circuit has the function of responding to initializing transmission command signals from the common control and then appropriately storing data assembly and transmission signals to be employed by the components of the communication adapter during the assembly of a frame of data and the multiplexing of the various bytes which make up a frame (as depicted in FIG. 2) in serial form for transmission to a remote terminal. For this purpose, the pretransmission control circuit includes a port address comparator 304, an address decoder 303, and an address register 302, a data register 301, a set of latch circuits identified as function registers 305, 306, and 307, and a function register selector 308. These circuits are also appropriately coupled to the control bits of the common control bus, so that they operate in accordance with a decoded sequence. For the sake of brevity of description and clarity of the illustration, the control bit connections have been omitted from FIG. 3, since a detailed illustration thereof is not essential for understanding and implementing the present invention. Essentially, the control bits of the CCB supply appropriate read/write command (read during transmission) and enable signals to be employed in conjunction with the signals on the address and data lines to initialize the adapter for the reading of data from memory and the assembly of the frame to be transmitted. During the receive mode, the adapter receives write command and enable signals from the control lines of the CCB, so that, once initialized, the receiver portion of the adapter may readily cause the data to be written into memory via DMA as it is received. In accordance with a preferred embodiment of the adapter, the pretransmission control circuitry shown in FIG. 3 and the pre-reception control circuitry of FIG. 8 are integrated together and may use common elements which carry out similar pre-operational procedures, such as address decoding and unitializing signal decoding and command latching. However, the adapter may employ separate pre-operational control circuits, if desired and, for purposes of clarity of illustration and explanation of the two modes of operation (transmission mode and receiver mode) of the adapter, the transmitter and receiver portions of the adapter will basically be described as separate units.

Port address comparator 304 has two sets of inputs, one of which has bit inputs A7-A2 selectively strappable to define a particular terminal adapter address so that it may be individually accessed by the common control for enabling the computer to communicate with another terminal, and the other of which is coupled to bits A7-A2 of the sixteen bit address portion of the common control bus. Thus, in the example described, up to sixty-four individual adapters may be accessed by the common control, although facility for more or less adapters may be provided simply by changing the address bit selections. Port address comparator 304 generates a match signal whenever it recognizes its address on bits A7-A2 from the CCB. This match signal is employed to enable an address decoder 303, which decodes the two least significant bits (LSBs) A1, A0, of the sixteen address bits of the CCB. Depending upon the state of the A1 and A0 bits, pretransmission control will implement prescribed functions, to be described below.

Each of address register 302 and data register 301 is coupled to the eight data bits (D7-D0) of the CCB. Address register 302 loads the contents of the data bits (D7-D0) as the address of a remote terminal to which a communication is directed when bits A1, A0 decode as 10. Data register 301 becomes enabled so that it can load the contents of the data bits (D7-D0) when bits A1, A0 decode as 00. Data register 301 is used throughout a frame transmission to successively load the data to be multiplexed out for transmission by frame multiplexer 40.

Function registers 305-307 are coupled to the five most significant data bits D7-D3 and respectively latch, or store, selected contents of these bits depending upon the contents of the three least significant data bits D2-D0 during transmission initialization. For this purpose, function register selector 308 decodes bits D2-D0 and selectively enables function registers 305-307 to cause them to latch the contents of bits D7-D3, as prescribed control signals for controlling the operations of the adapter during the transmission of a frame. Abbreviations for these various control signals are shown on the output bit lines of function register 305-307. The particular generation and effect of these signals will be explained subsequently in connection with the operation of the transmission portion of the adapter.

Frame Multiplexer-Transmitter (FIG. 4)

The actual transmission of a frame of data is controlled and effected by the constituents of the frame multiplexer-transmitter shown in FIG. 4. Each bit of a frame of data—from the beginning flag byte to the terminating flag byte—is sequentially shifted out from a serial shift register 408 over communication link 481 to the remote terminal. The control of the overall multiplexing and assembly of the entire frame is sequentially controlled by frame transmission control circuit 409. Frame transmission control circuit 409 is coupled to function registers 305, 306, and 307 within the pretransmission control circuit shown in FIG. 3 and, in accordance with the levels of the various output bits of these function registers, causes the other components of the frame multiplexer to operate in the proper sequence to establish and successively multiplex out a frame of data of the format shown in FIG. 2. For this purpose, control circuit 409 is constructed of appropriate combinational logic and timing circuitry, which generate necessary enabling and gating signals at selected times in accordance with a system clock. The particular design of the combinational logic employed may take various forms readily implemented by a skilled artisan, given the sequence of events (described below) which take place during the transmission of a frame. The various signal control lines from control circuit 409 to the respective components of the frame multiplexer are depicted and will be described in conjunction with the interconnection and operation of the adapter.

As was described above, each byte of the frame is multiplexed out bit-by-bit through serial-in, serial-out shift register 408 over the communication link 481 to the remote terminal. The serial data input of register 408 is connected to an OR gate 412 which is coupled to appropriate circuits from which the contents of the frame of data to be transmitted are obtained. A first input of OR gate 412 is coupled to flag register 403, the inputs of which are hard-wired with the unique flag byte code (0111 1110) described previously. Under the control of gating signals FS REG PULSE from control circuit 409, flag register 403 is loaded with the flag byte (e.g. 0111 1110) to be clocked out through OR gate 412 for serial transmission via register 408.

Information, stored in memory, to be assembled and transmitted, is coupled over the eight parallel data bits D7–D0 of lines 311 and 322 supplied from data register 301 and address register 302, shown in FIG. 3.

The address byte 21 of FIG. 2, which follows the first flag byte 20, is stored in the address register 302 and coupled to parallel to serial register 402 via multiplexer-register 401 after generation of the frame-beginning flag byte 20 by flag register 403. Therafter, the multiplexer-register 401 is switched to receive the contents of the data register 301 over line 311 for subsequent transmission of the control field 22 and information (I) field 23. Control of multiplexer-register 401 is effected by way of word select input WORD SEL and a word select clock input WORD SEL CLK which are generated by control circuit 409 to respectively instruct multiplexer 401 which register (address or data) poutputs are to be loaded, and when they are to be loaded.

The output of multiplexer-register 401 consists of eight parallel data bit lines D7–D0 which are connected in parallel to serial register 402. The contents of lines D7–D0 are loaded into register 402 in accordance with a pulse signal DS REG PULSE from control circuit 409. The DS REG PULSE signal is generated by control circuit 409 in response to the carry output from carry counter 400. Normally, during the assembly and transmission of eight bit bytes, the presettable byte line inputs to the stages of counter 400 supply the binary number 000 which is loaded into counter 400 via inverter 415 at each carry. Thus, counter 400 will count up from 000 to 111 and recycle to 000, providing a carry signal every eight clock pulses. However, in accordance with the dynamic byte size control feature of the system, carry counter 400 may be loaded with a number other than 000 and caused to recycle in less than eight clock pulse time. When this happens, DS REG PULSE is of a width sufficient only to load the contents of lines D0–Dx (where 3≦x≦7) from register 401 which correspond to the reduced number of clock pulses counted by counter 400. The output of an OR gate 414 is coupled to another control input or register 402 for selectively inhibiting or enabling the operation of the register. The contents of register 402 are clocked out in sequence at a rate determined by the system clock applied to the CLK input of the register. A further input SER is coupled to a serial input line. SER INPUT coupled to abort circuit 416 which causes register 402 to clock out eight consecutive one bits during an abort condition.

The serial data output from register 402 is coupled over line XMIT DATA to data control circuit 404 which is formed of appropriate logic circuitry to effectively multiplex the serial output of register 402 or frame check sequence control circuit 406 to OR gate 412 during presecribed intervals of the frame, other than during the transmission of a flag byte. The output of register 402 is also coupled to frame check sequence register 405 which generates and stores a frame check sequence field in accordance with a preselected function such as a conventional frame check sequence polynomial. This field is supplied to frame check sequence control circuit 406 for insertion into the frame by data control circuit 404 sbusequent to the transmission of an information field. Clocking of most of the components of the transmitter is controlled by clock control circuit 410, which receives system clock inverted by inverter 411. Clock control circuit 410 is a gating circuit which normally couples system timing to various components of the transmitter, except during zero bit insertion to be described below.

From OR gate 412, serialized data is coupled to a serial-in/serial-out register 408, the output of which is coupled to the data link 481 to the remote terminal. Clocking of the data through register 408 is controlled by the system clock. The contents of the stages of register 408 are coupled to zero bit insertion control circuit 407, the output of which is a block clock signal BLCK CLK. The BLCK CLK signal is coupled to a control input of register 408 to controllably inhibit the shifting of the output of OR gate 412 into register 408 during the zero bit insertion operation. Zero bit insertion control circuit 407 is formed of combinational logic for detecting the presence of five consecutive one bits in succesive stages of register 408, and thereupon generating a BLCK CLK signal. During the generation of a flag byte (six consecutive ones) and during abort (eight cconsecutive one bits), zero bit insertion control circuit 407 is disabled by FLAG CLK INH and ABORT EN control signals, respectively. The BLCK CLK out of zero bit insertion control circuit 407 is also coupled to clock control circuit 410 and carry counter 400 inhibit each of these circuits during zero bit insertion. In addition, the BLCK CLK signal is also coupled to register 302 via inverter 413 and OR gate 414 to prevent shifting of data during zero bit insertion, so as to avoid missing the data bit which would otherwise occupy the inserted zero's bit position. OR gate 414 also receives a data clock inhibit signal DATA CLK INH from control circuit 409 for normally enabling register 402.

Figure 7:
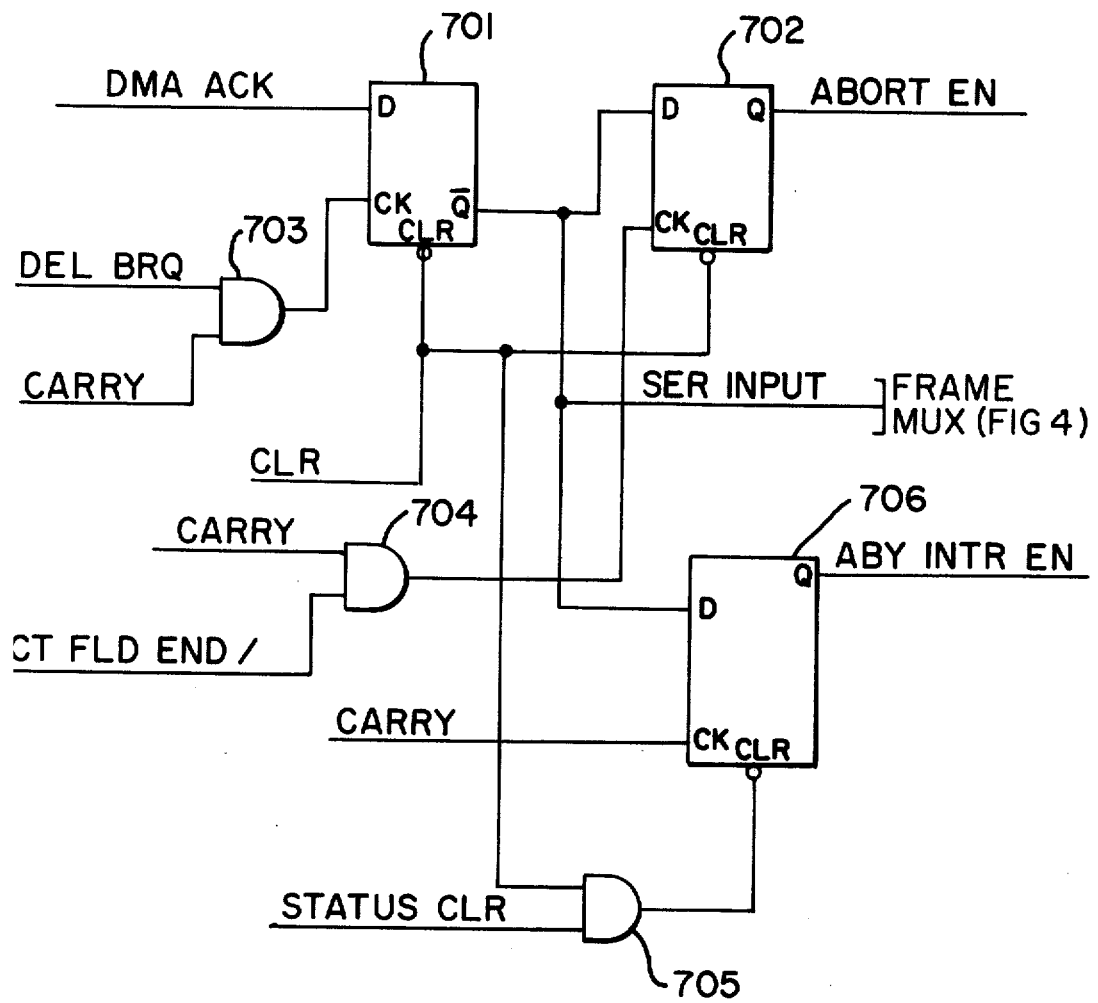
FIG. 7 is a detailed circuit diagram of an abort control circuit.

The generation of an abort character is controlled by abort control circuit 416 (the details of which are shown in FIG. 7) which responds to a timed relationship between DMA signals from DMA control circuit 608 and the carry output of carry counter 400. As will be described below, when a frame is to be aborted, signals are supplied on the ABT INT EN line to place an abort detection signal in status register 420, to advise the common control of the termination of the frame. Status register also is coupled to control circuit 409 and supplies an end of frame interrupt signal to the CCB when control circuit 409 sets the appropriate bit in register 420 at frame completion.

Figure 5:
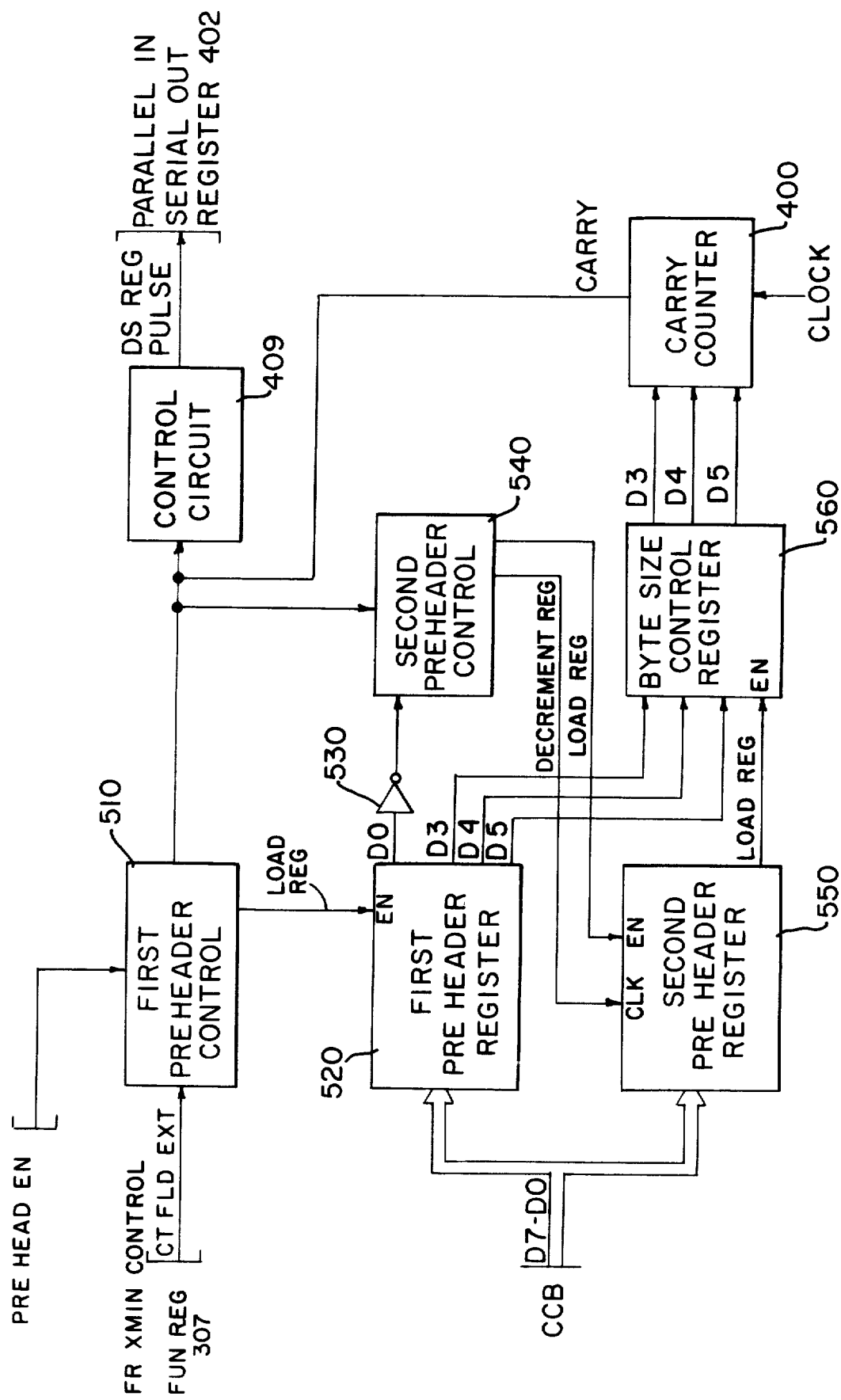
FIG. 5 depicts the details of an information field assembly circuit.

I Frame Assembly Control (FIG. 5)

As was described previously, in connection with the format of a frame of data as depicted in FIG. 2, there may be included an information field (I field) which is transmitted immediately subsequent to the transmission of the control byte. Assembly of the information field and control of its insertion into the data frame is initiated by I field assembly control circuit 50. Referring now to FIG. 5, there are shown first and second pre-header registers 520 and 550, respectively, coupled to the data bits D7-D0 of the common control bus.

The first pre-header register 520 is controlled by a first pre-header control circuit 510, which responds to appropriate control signals to be described below and selectively enables first pre-header register 520 to store the contents of data lines D7-D0. Similarly, second pre-header register 550, which comprises a down counter, is controlled by a second pre-header control circuit 540, which responds to prescribed input signals, to be described below, and selectively enables register 550 to both load the contents of data lines D7-D0 and subsequently decrement its contents. Specifically, second pre-header control circuit 540 receives the carry signal from carry counter 400 (FIG. 4) and from inverter 530 which is coupled to the D0 bit stage of register 520. Byte size control register 560 is coupled to store the contents of the D5, D4, and D3 bit stages of first pre-header register 520, when the contents of the second pre-header register 550 have been decremented to a selected value, e.g. zero, so that an enable output signal is delivered to byte size control register 560 causing it to store the two's complement of bits D5, D4 and D3, representing the byte size of the data stream.

The outputs of the stages of byte size control register 560 are coupled to the presetable byte lines of carry counter 400 (FIG. 4) which up-counts the binary number supplied on inputs D5, D4, and D3, in accordance with a system clock signal, and generates a carry signal upon recycling at overflow. As was described previously in conjunction with FIG. 4, because the stages of carry counter 400 are coupled to presetable byte lines (the outputs of register 560), carry counter 400 will recycle to whatever binary value is contained in bit lines D3, D4, and D5. The carry signal is applied to a control circuit 409 (FIG. 4), the DS REG PULSE output of which is applied to parallel-in/ serial-out register 402 (FIG. 4) to control the loading of the contents of the stages of multiplexer register 401 into register 402. The carry signal is also applied to first pre-header control circuit 510 and second pre-header control circuit 540.

In accordance with the present invention, the I frame assembly control circuitry shown in FIG. 5 selectively controls the byte size of each data word making up the information (I) field which follows the control field in the frame. Dynamic control of the byte size of the words of which the I field is composed may be achieved by selectively encoding a pair of pre-header bytes or octets which are retrieved from memory and stored in registers 520 and 550. This dynamic control permits the size of data bytes transmitted to depart from the normal eight bits/byte format used for flag, address, control, pre-header, and header bytes, so that a more rapid communication between terminals can take place where the encoded data being transmitted does not require the use of eight bits/byte.

For example, if there is to be a byte size change from the normal eight bits/byte to five bits/byte, then at the point in the data transmission where the change is to occur, I field assembly control circuit 50 will cause register 402 to load only bits D0-D4 from multiplexer register 401, since bits D5-D7 contain no useful information. Thus, only bits D0-D4 will be serially clocked out of register 402 and transmitted as the new byte size of five bits/byte.

More specifically, control of the operation of I frame assembly control circuit is effected by an initial set of control bytes, supplied from the common control, which precede the data field. The format of the overall data field including the bytes which control the operation of the I frame assembly control circuit has been described above with reference to FIG. 2. As is shown therein, the first pre-header byte 26 is composed of the eight binary bits D7-D0. Its least significant bit (LSB) D0 represents whether or not a byte size change is to occur in the bytes which follow the pre-header bytes. Where there is to be no byte size change, D0=1, and pre-header byte 1 is followed immediately by the DATA field 29, each data byte being composed of all eight bits D7-D0. If D0=0, a byte size change is to occur and, moreover, the first pre-header byte is followed by a second pre-header or count byte 27 and a header field 28 preceding the data field. When D0=0, the first pre-header byte also contains information representative of the byte size of the data bytes after the change occurs. This information is contained in selected bits (e.g. D5, D4, D3) of the first pre-header byte, encoded in two's complement binary code. Table 1 below shows such encoding for defining the byte size after the change.

TABLE 1

| (coding of byte size bits D5, D4, D3) | | | |
|---|---|---|---|
| D5 | D4 | D3 | two's complement |
| 0 | 0 | 0 | 8 bits/byte |
| 0 | 0 | 1 | 7 bits/byte |
| 0 | 1 | 0 | 6 bits/byte |
| 0 | 1 | 1 | 5 bits/byte |
| 1 | 0 | 0 | 4 bits/byte |

Bit D7 of first pre-header byte is a redundancy bit used to indicate the presence or absence of header field 28 while the other bits may be used for various indicator functions, a description of which will not be presented here since it is unnecessary for an understanding of the present invention.

The second pre-header or count byte 27, which may follow the first pre-header byte depending upon the state of bit D0 of the first pre-header byte, is an eight bit binary code specifying the number of eight-bit bytes which are to follow the count byte 27 before a change in byte size occurs. Following the count byte 27 is a header field 28 of N eight bit bytes, N corresponding to the binary number represented by bits D7-D0 of count byte 27. Byte 28 is then followed by a data field 29 made of M bytes, the bit length of which is defined in the selected bits (D5-D3) of the first pre-header byte 26. Thus, the header may be considered to be that portion of the transmitted data, subsequent to the count byte, during which there is no departure from the normal eight bits/byte format.

A detailed description of the operation of I frame assembly control circuit 50 and the impact of the above-described encoding of the first and second pre-header octets will be presented below in conjunction with the transmission operation of the adapter.

DIRECT MEMORY ACCESS CONTROL (FIG. 6)

Figure 6:
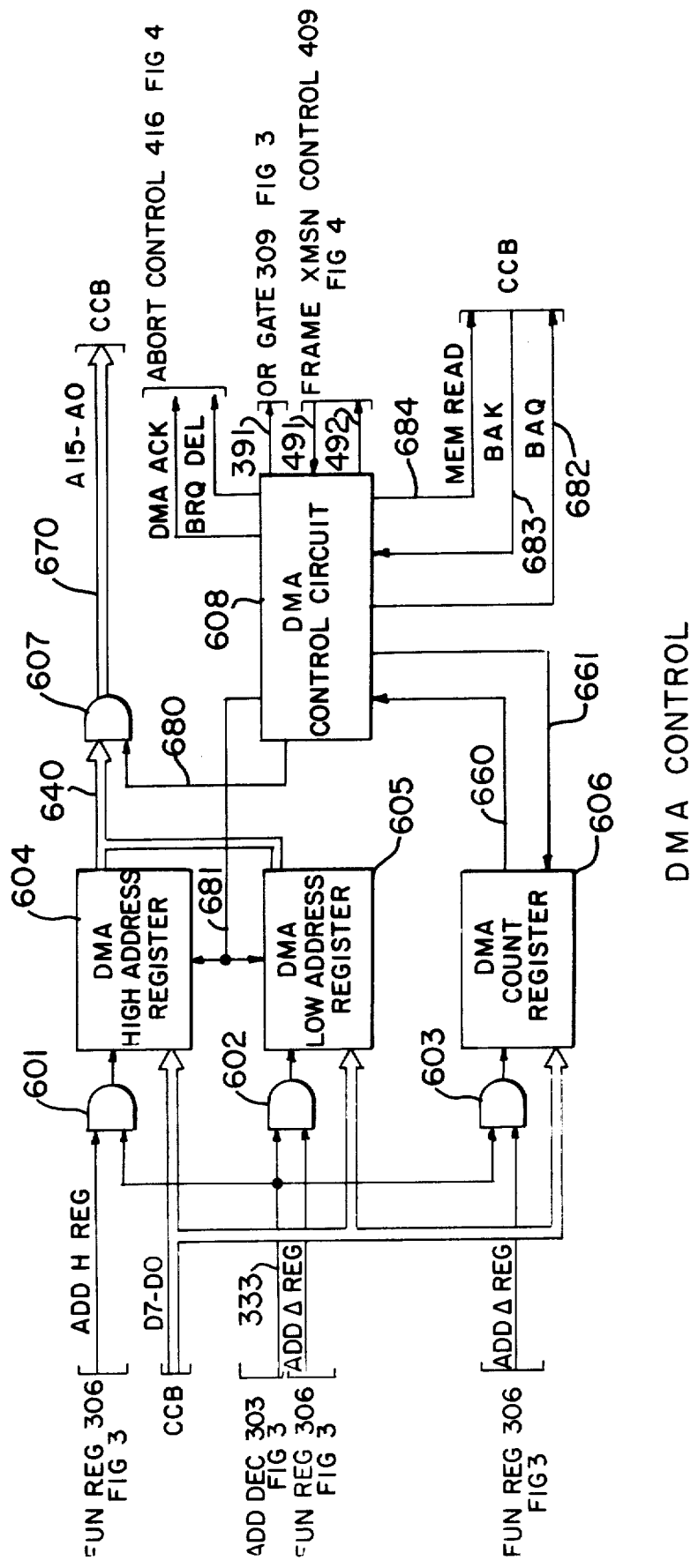
FIG. 6 illustrates the detailed configuration of a direct memory access control circuit.

The contents of the information field of the data frame are obtained from the terminal memory under the control of DMA control circuit 60, shown in detail in FIG. 6. For this purpose, registers 604, 605, and 606 are employed to store the memory location of the data to be transmitted and the (memory) size of the data field. Each of DMA high address register 604 and DMA low address register 605 is an eight bit register for storing the eight MSBs and eight LSBs of the initial sixteen bit address in memory from which data is to be accessed. A third register, DMA word count register 606, stores the number of memory addresses which contain the data to be transmitted. Register 606 may be an eight bit register so that up to two hundred fifth-six address locations may be accessed. The outputs of registers 604 and 605 are combined over lines 640 to gate 607 which, when enabled via line 680 from DMA control circuit 608, supplies a sixteen bit address over its output 670 to the common control bus. Like frame transmission control circuit 409, DMA control circuit 608 is formed of appropriate combinational logic and counter circuitry for sequentially implementing DMA operations in accordance with the input signals applied thereto. Again, to facilitate the description of the invention, a detailed description of such combinational logic and counter circuitry will be omitted and the explanation instead will treat the various input and output signals of the DMA control circuit 608, and their functional effect on the system.

Each of registers 604, 605, and 606 is coupled to the CCB to receive the eight D7–D0 data bits. Selective storage of the contents of the data bus is controlled by enabling signals from gates 601, 602, and 603, respectively. One input of AND gate 601 is an ADD H REG line from function register 306 (FIG. 3), while the other input is obtained over line 333 from address decoder 303 (FIG. 3). The loading of DMA low address register 605 is controlled by the input ADD L REG from function register 306 and by the state of line 333 from address decoder 303, which are connected to the inputs of AND gate 602. The DMA count register 606 will store the contents of the data bus when AND gate 603 is enabled by signal levels on line 333 and an ADD Δ REG signal from function register 306. Upon the read out of the data in each memory address, DMA control circuit 608 enables data register 301 (FIG. 3) via an enabling signal over line 391 to OR gate 309 in pretransmission control circuit (FIG. 3). It also decrements the contents of register 606 by one bit via line 661 and increments the address stored in registers 604 and 605 via line 681. Upon the contents of register 609 being decremented to zero, a carry signal is supplied over line 660 to DMA control circuit 608 to inform DMA control circuit 608 of the completion of read out of data from memory. DMA control circuit 608 now sends an end of data signal over line 492 to frame transmission control 409 so that it may commence transmission of the frame check sequence field.

DMA control circuit 608 is also coupled to the control bus portion of the CCB via lines 682, 683, and 684. When data is to be read out from memory for transmission, DMA control circuit 608 receives a control signal on line 491 from frame transmission control circuit 409. A bus acquisition request signal (BAQ) is delivered to the common control over line 682. This signal is delayed by way of a high speed clock and a BRQ DEL signal is supplied to abort control circuit 416 (FIG. 4). When the memory is ready to be accessed, a bus acknowledgement (BAK) signal is delivered over line 683 to DMA control circuit 608 from the CCB and a direct memory access acknowledgement signal DMA ACK is coupled to abort control circuit 416. A memory read signal MEM READ is coupled to the CCB over lead 684, so that the data from the addressed memory may be read out for transmission. If a bus acknowledge (BAK) signal is not delivered to DMA control circuit within a prescribed time limit (one complete data byte length) after the BAQ signal, no DMA ACK is supplied to abort control circuit 416 causing it to then generate an abort enable signal, ABORT EN, and a serial input signal, SER INPUT, so that frame multiplexer transmitter 40 will generate and transmit an abort character (11111111) to the remote terminal. Also, an abort interrupt signal, ABORT INT EN, to advise the processor of abortive frame termination, is generated.

Abort Circuit

The aborting of the transmission of a frame of data may be responsive to a failure of inability to access data from memory, as described above. Specifically, when the direct memory access control circuit 608 accesses data from memory, it supplies a bus request signal, BRQ, over the control portion of the CCB to the processor.

DMA control circuit 608 then waits for a bus acknowledgment signal BAK from the CCB. If the BAK signal is not received with a prescribed period of time after generation of BRQ, the frame is aborted. The prescribed length of time is the time required for serializing a byte of data, i.e. one cycle of the carry counter 400 (FIG. 4). The BRQ signal is generated at the beginning of a byte cycle and via a high speed clock, a delayed bus request signal DEL BRQ is generated to enable one of the input of AND gate 703, shown in FIG. 7.

The output of AND gate 703 is connected to the clock input of flip-flop 701. The other input of AND gate 303 is coupled to the carry output of carry counter 400 (FIG. 4). The state input of flip-flop 701 is coupled, via line DMA ACK, to the DMA control circuit 608 which receives the BAK signal from the CCB. The Reset or $\bar{Q}$ output of flip-flop 701 is connected to the state input of each of flip-flops 702 and 706 and also the serial input line SER INPUT of parallel to serial register 402 (FIG. 4). The clock input of flip-flop 702 is connected to the output of AND gate 704 one input of which is connected to the carry output of carry counter 400 and the other liquid of which is coupled to function register 307 in pretransmission control circuit 30 (FIG. 3). The clock input of flip-flop 706 is coupled to the carry output of carry counter 400. A status clear signal STATUS CLR is applied to one input of AND gate 705, the output of which is connected to the clear input of flip-flop 706. The clear inputs of flip-flops 701 and 702 are coupled with the other input of AND gate 705 to receive a clear or reset signal CLR. The set or q output of flip-flop 702 represents the abort enable condition ABORT EN. The Q output of flip-flop 706 represents an abort interrupt enable condition ABT INT EN to be supplied to the processor.

As was described above, during normal operation of the system, DMA control circuit 608 (FIG. 6) receives a bus acknowledgement signal, BAK, over the CCB within the byte cycle time governed by the counting cycle of carry counter 400. The BAK signal causes the DMA ACK signal to be high. Accordingly, when carry counter 400 recycles at the end of a byte and generates a carry signal, due to the high level on the state input of flip-flop 701, its output does not change state and each of flip-flops 701, 702, and 706 remain in their initially cleared condition. The levels of the ABORT EN and ABT INTR EN lines remain low so that no abort condition is generated.

However, should DMA control circuit 608 not receive a bus acknowledgement signal BAK within the byte cycle time, the DMA ACK line will be low when a carry signal is generated, causing the $\bar{Q}$ output of flip-flop 701 to change state. This also causes a change in state of each of flip-flops 702 and 706. The change in stage of the $\bar{Q}$ output of flip-flop 701 causes a continuous "one" level to be supplied to the serial input of parallel to serial register 402 (FIG. 4). The ABORT EN signal causes data control circuit 404 to lock onto the XMT DATA serial line output of register 402 and inhibits bit insertion circuit 407. A series of eight "one"s is now sent out to the remote receiver as an abort character. The ABORT INTR EN is coupled to status register 420 to provide a status indication that the ABORT character (11111111) has been transmitted, i.e. the frame has been terminated. Subsequently, the system is reset by a reset or clear signal and is prepared for another frame.

Transmitter Operation

Referring now to FIGS. 1 through 7, the operation of the transmission of a complete frame of data which includes an information field (I field) having a change in byte size of the data will be described.

Pretransmission Initializing

Initially, whenever the processor of the terminal with which a particular data communications adapter is associated desires to communicate with a remote terminal or terminals, it will supply a set of address, data, and control signals on the common control bus. The control bus contains the appropriate read/write (read for transmit mode, write for receive mode) and enable signals. The CCB also couples selected pretransmission control information from the processor by way of the address and data portions of the CCB. The address bits, A7-A2, identify the particular communication adapter from which the data transmission to the remote terminal is to take place. Address bits A1-A0 contain prescribed control information. Upon recognizing its port address on line 340, port address comparator 304 generates an "address match" signal on line 342 which causes address decoder 303 to decode the two least significant bits A1, A0, of the address line 330. Now, the operations carried out by the components of the pretransmission control circuit will depend upon the binary states of bits A1, A0. First, the function registers 305-307 must be appropriately loaded with prescribed pretransmission control information.

Initially, the processor inhibits error monitoring and checking functions. When address decoder 303 decodes a "01," it enables function register selector 308. The contents of the data bits D7-D3 are next selectively stored in registers 305-3-7 respectively, as bits D2-D0 cause function register selector 308 to successively enable the function registers 305-307. Function register 307, which is essentially used for error checking/diagnostic purposes, is loaded with the appropriate D7-D3 bits to disable all checking functions.

After inhibiting checking operations, the processor prepares the adapter for DMA data retrieval. When enabled over line 382, function register 306 is loaded with appropriate bits D7-D3 for DMA control purposes. The D3 bit of register 306 goes high and the decoding of a "11" of address bits A1, A0 by address decoder 303 causes it to enable AND gate 601 within DMA control 60 via lines 33, and DMA high address register 604 is loaded with the eight MSBs of the starting memory address of the data in the I field. Next, the D4 bit of register 306 is loaded with a "1" to enable AND gate 602 so that DMA low address register 605 will store the eight LSBs of the same starting memory address. Then, the D5 bit of function register 306 is caused to go high and the number of data words in memory to be transmitted is stored in DMA word count register 606 as AND gate 603 is enabled by the ADDΔREG signal. After each of the registers 604, 605, and 606 of DMA control have been loaded, the D3, D4, and D5 bits of function register 36 are loaded with "0"s to disable further gating into the DMA registers. The DMA control is now prepared to commence accessing data from memory when instructed to do so by the frame transmission control circuit 409.

Having prepared the adapter to access data from memory, the processor may next proceed to enable the adapter to proceed with a transmission. For this purpose, the A1, A0 address signals from the CCB become (1,0) and cause address decoder 303 to enable address register 302 to be loaded with the address of the remote terminal to which the transmission is to be directed. Thus, the contents of line 322 are not the actual address field. As was described above, the address field may be the address of only one remote terminal, (unique address) or the address of a plurality of remote terminals (group address, global address) to which the frame of data is directed, depending upon the intended scope of communication. Since the operation of the transmitter portion of the adapter does not depend upon the address of the adapter to which the transmission is directed, a detailed discussion of the impact of the type address defined within the actual address field will be deferred until the description of the receiver portion of the adapter given below.

The next group of address bits A1, A0, on the CCB (0,0) cause the address decoder 303 to enable data register 301 via line 331, gate 309, and line 312. The present contents of data lines D7-D0 are now loaded into register 301 as the eight bit control byte to follow the address byte stored in address register 302. After loading registers 302 and 301 with the address and control bytes of the data frame, the processor sets up the adaptor to commense the transmission of data. For this purpose, function register selector 308 decodes D2-D0 to enable function register 305 via line 381 and function register 305 is selectively loaded so that bits D3 and D5 go high, to initiate the transmission of a data frame.

Frame Transmission

Beginning Flag Byte Transmission

In response to the SEND and CR signals latched in function register 305, control circuit 409 generates FS REG PULSE and DS REG PULSE signals. The FS REG PULSE signal causes the 0111 1110 hardwired inputs to flag register 403 to be loaded in parallel. At this time, control circuit 409 also responds to the transmission request by generating a FLAG CLK INH signal which enables the serial shifting out of the loaded contents of register 403 through OR gate 412, while disabling zero bit insertion control circuit 407. As the beginning flag of the frame is being shifted out through register 408 as a serial bit stream to the remote circuit, in accordance with the system clock CLK, control circuit 409 generates WORD SEL and WORD SEL CLK signals causing multiplexer register 401 to select the address byte lines 322 from address register 302, and load their contents. The DS REG PULSE signal from control circuit 409 causes the bits of the address byte stored in multiplexer register 401 to be loaded into parallel-in, serial-out register 402.

Address Byte Transmission

At the end of the last bit or eighth bit of the flag byte, control circuit 409 causes the FLAG CLK INH signal to go high, disabling register 403 and enabling zero bit insertion circuit 407; the DATA CLK INH signal goes from high to low and, via OR gate 414, enables the serial shifting out of the bits of the address byte stored in register 402. During this process, the WORD SEL signal causes multiplexer register 401 to switch to receive the contents of the data lines 311 from the data register 301, which are loaded by the WORD SEL CLK signal. With each carry signal from carry counter 400 new FS REG PULSE and DS REG PULSE signals are generated by control circuit 409 to cause a re-loading of parallel to serial registers 402 and 403. Of course, the contents of register 403 are not serialized out since it is disabled by the level of the FLAG CLK INH input at this time.

Data control circuit 404 supplies the address byte serially clocked out of register 402 to OR gate 42 to be coupled to serial-in, serial-out register 408 for transmission.

Control Byte Transmission

After the address field is clocked out, the subsequent control field supplied via data register 301 and stored in multiplexer 401 is loaded in register 402 at the next DS REG PULSE and then serially clocked out to the remote terminal in the same manner as described above in connection with the address byte. As the contents of parallel-to-serial register 402 are shifted out, beginning with the transmission of the address field (described above), they are applied to FCS register 405 and FCS control circuit 406, causing an FCS character to be generated and stored in register 405 which will eventually follow the information field.

"0" Bit Insertion

During the transmission of those portions of the frame other than the flag byte, zero bit insert control circuit 407 will be enabled since the FLAG CLK INH signal is high and goes low only during the transmission of a flag byte. If zero bit insertion circuit 407 detects the occurrence of five consecutive one bits as the data is clocked through register 408, a BLCK CLK signal is immediately generated. THE BLCK CLK signal is generated for one bit time to temporarily disable serial clocking of register 402 via OR gate 414. It also disables FCS register 405, and carry counter 400 via clock control circuit 410. In addition, the BLCK CLK signal forces the first stage of register 408 to load a zero with the next clock pulse so that the five consecutive ones will be followed by an inserted dummy zero bit. At the end of this one bit clock time, the BLCK CLK signal changes state and normal operation of the system is resumed.

I Field Assembly and Transmission

As the control byte is being transmitted, frame transmission control field, in response to the high input on the DMA SEND line, indicating the presence of an information field, will activate DMA control circuit 608 via line 491. A bus acquisition signal BAQ is generated by DMA control circuit 608 and coupled to the CCB via lead 682. Assuming that a bus acknowledgement signal BAK is received from the processor over line 683 within a prescribed period of time, a memory read, MEM READ, signal is coupled to the processor over line 684 via the CCB. A data gating signal is supplied over line 391 from DMA control circuit 608 to gate 309 so that the data read out of memory will be stored in data register 301. When frame transmission control circuit 409 is informed via line 492 of the return of a bus acknowledgement signal by DMA control circuit 608, it supplies a PRE HEAD EN signal to the first pre-header control circuit 510. It is assumed that the CT FLD EXT signal which inhibits the operation of the I frame assembly control circuit has changed state, the control field including any extension having been handled by the system. After causing the clocking out of the previous control field through register 402, carry counter 400 generates a carry signal so that the next byte of data (in this case, the first byte of the information field) can be serialized. In response to this signal and the PRE HEAD EN signal, first pre-header control circuit 510 generates a load register signal to enable first pre-header register 520 which thereby loads the contents of the data bits D7–D0 on the CCB. At the same time, these first pre-header bits are being loaded into data storage register 301 (FIG. 3) since the first pre-header byte is part of the data to be transmitted and is necessary for data decoding at the receiver terminal. In the absence of dynamic control or upon being reset (reset inputs have not been shown in the drawings for purposes of clarity) the contents of byte size control register 560 are zeros, so that carry counter 400 counts from (000) through (111) in accordance with its input clock and recycles to (000). Thus, the carry signal is generated every eight bits and the width of the DS REG PULSE corresponds to the eight bit length of the data byte, so that all eight parallel bits D7–D0 stored in register 401 are loaded into and serialized out of register 402 for transmission.

The carry signal from carry counter 400 is applied to first pre-header control circuit 520 and second pre-header control circuit 550. The PRE HEAD EN signal is no longer supplied from control circuit 409 (the first pre-header field having been already coupled over the CCB) so that first pre-header control circuit 510 does not generate another LOAD REG signal which would cause first pre-header register 520 to load the contents of the data portion of the CCB. Instead, since the level of the D0 stage of register 520 is a "0," indicating a byte size change will take place, the output of inverter 530 is a "1" which, together with the carry signal, causes a LOAD REG signal to be delivered to the enable input of second pre-header register 550, whereby the contents of data lines D7–D0 which presently contain the second pre-header or count byte are loaded into the second pre-header register 550. The LOAD REG signal may also internally feed back within control circuit 540 to inhibit further loading of register 550 until the system is reset for a subsequent data frame. Control circuit 540 also contains approprate combinational logic which generates prescribed control signals in accordance with the input signals applied thereto, as described. Various implementations may be employed by those skilled in the art and, again, for purposes of simplification, the specifics of the logic have not been illustrated in detail.

Upon receipt of subsequent carry signals from counter 400, control circuit 540 supplies a DECREMENT REG signal to register 550 to decrement its contents. As was described previously, the contents of register 550 are indicative of the number of bytes subsequent to the second pre-header or count byte during which there is no change in byte size. Thus, carry counter 400 continues to count from (000) to (111) and recycle to (000), generating a carry signal for each eight clock pulses counted and thereby causing parallel-in, serial-out register 402 to load eight bits for the second pre-header byte and each subsequent (header) byte until there occurs a byte size change.

Upon second pre-header register 550 being decremented to zero, it generates a carry or LOAD REG signal which is supplied to byte size control register 560. Register 560 loads the contents of the D5, D4, and D3 stages of register 560. For the example chosen, i.e. a byte size change from eight bits/byte to five bits/byte, the contents of these stages of register 520 are, in accordance with Table 1: D5=0, D4=1, and D3=1. Carry counter 400 now beings counting clock pulses from the binary number 011 (i.e. a decimal 3) and generates a carry signal upon recycling from 111 to 011 again. Thus, carry counter 400 generates a carry signal for every five clock pulses counted, rather than for every eight clock pulses as it had previously. The width of the DS REG PULSE signal from control circuit 409 is now only sufficient to enable parallel-in, serial-out register 402 to load bits D0–D4, i.e. five bits, from multiplexer register 401. Thus, only five bits per byte will be serialized out and transmitted to the remote receiver terminal, until completion of the I frame.

Frame Check Sequence Word Transmission

As each word of the information field is serialized out from register 402, it is supplied to FCS control circuit 406 and frame check sequence register 405, which cause a frame check sequence word, to follow the I field, to be generated.

Upon the contents of DMA count register 606 having been decremented down to zero, a carry signal on one line 660 causes DMA control circuit 608 to advise the frame transmission control, via line 492, that the reading out of the information field from memory has been completed. This caused frame transmission control circuit 409 to enable FSC control circuit 406 so that the frame check sequence word, which had been generated during the transmission of the address, control, and information fields, may be coupled to register 406 via data control circuit 404 and OR gate 412. The frame check sequence word is thus sent out in serial form through serial shift register 408 to the remote terminal.

Terminating Flag Byte Transmission

Upon completion of transmission of the frame check sequence, frame transmission control circuit 409 once again disables zero bit insertion circuit 407 by changing the state of the FLAG CLK INH input and enables flag register 403. The next FS REG PULSE loads the flag byte (0111 1110) to be serially shifted out via OR gate 412 and serial shift register 408, indicating a completion of the frame of data.

By way of a reset line (not shown), frame transmission control circuit 409 causes bits D3 and D5 of function register 305 to go low. In addition, an end of frame signal is coupled from control circuit 409 to status register 420 so that an appropriate interrupt signal will be coupled over to the processor via the CCB.

Receiver Configuration

As was described briefly above, the communications adapter according to the present invention may be employed to transmit data from its associated processor to one or more remote terminals. It may also receive a serial data frame from a remote terminal and couple the received data to the processor and memory. Provision of this duplex mode of operation is effected by data handling configurations which are both structurally and operationally similar (thereby simplifying compatability) for the transmitter and receiver portions of the adapter. The description below will treat the configuration and operation of such receiver portion of the adapter using the frame sequence example described for the transmission portion of the adapter.

Figure 1B:
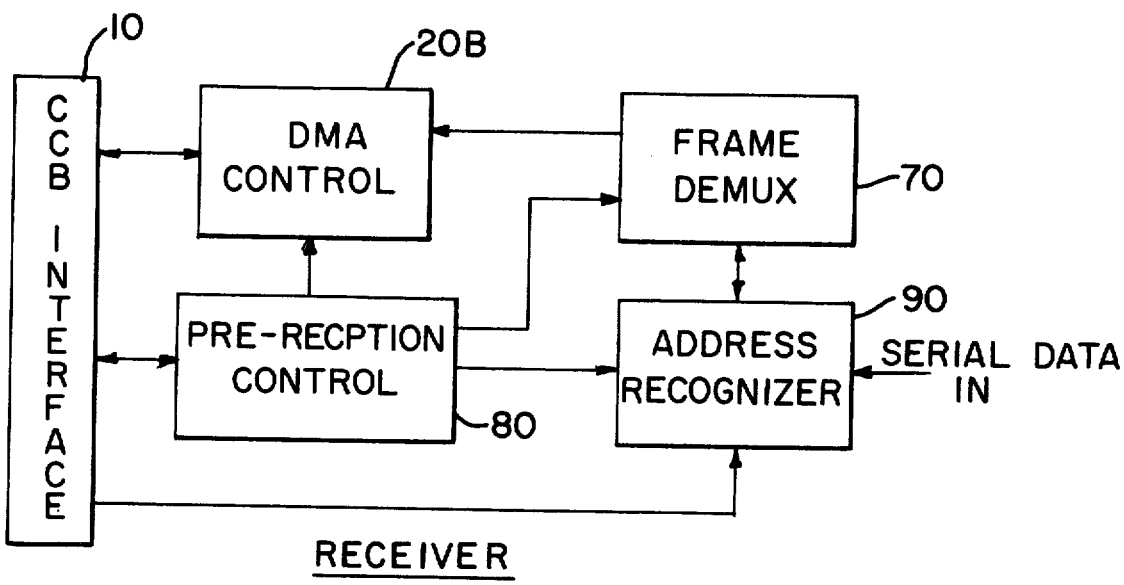

A simplified block diagram arrangement of the components of the receiver portion of an adapter is shown in FIG. 1B. Like the transmitter portion of the adapter, the receiver portion is coupled to the associated processor and memory via a common control bus interface 10. Initializing control signals are supplied from the CCB to a pre-reception control circuit 80, the details of which will be described below in conjunction with FIG. 8, so that the adaptor can proceed to monitor and receive incoming data by itself with coupling of received data into memory being effected by DMA control circuit 20B. Pre-reception control circuit 80 is coupled to frame demultiplexer 70 and address recognizer 90. Address recognizer 90 is coupled to a serial data line by way of which a serial data frame from a remote transmitting terminal is transmitted. Once enabled by pre-reception control circuit, address recognizer 90 monitors the line for a data frame. Detection of a flag byte causes address comparator circuitry to be activated, and the address field of the monitored frame to be compared with address information stored in the adapter. If address recognizer 90 detects that the address field contains an address code assigned to it, then the other components of the adapter, including frame demultiplexer 70 and DMA control 20B, are activated to carry out the proper disassembly and storage into memory of the incoming serial data frame. Frame demultiplexer 70, the details of which will be described below in connection with FIG. 10, also contains error detection circuitry for monitoring the quality of the frame of data.

Pre-reception Control

FIG. 8 depicts the configuration of pre-reception control circuitry which generates and stores appropriate receiver command signals to be used by the adapter for properly monitoring incoming data and enabling demultiplexing of the data for storage into memory by DMA.

As in its transmitter portion, the adapter has an adapter port address comparator 804 coupled to receive address bits A7–A2 from the common control bus on line 840, bits A7-A2 being compared with selectivity strappable address bits A7-A2 from bus line 841. The other bits, A1, A0, from the CCB are coupled over line 880 to A1, A0 address bit decoder 803. Decoder 803 has control inputs coupled to line 842 from comparator 804 and line 811 from receive/write control circuit 801. When enabled, decoder 803 decodes the contents of bits A1, A0 and selectively enables function register selector 805, via line 832, and selected registers 910-913 shown in FIG. 9, via line 833. Function register selector 805 is connected to the CCB via line 850 and line 851. When enabled by decoder 803, selector 803 decodes the contents of bits D2-D0 and causes one of the registers contained within function registers 806 to be loaded with the remaining contents of data bus bits D7-D3 supplied over line 860 as stored command signals to be used during reception of a data frame. Receive/write control circuit 801 is coupled to the control portion of the CCB via line 810 and in response to control commands from the processor, activates the circuitry of the receiver portion of the adapter so that it may be ready to receive data and write the data into memory.

As was described previously in connection with the description of the pretransmission control circuitry shown in FIG. 3, the components of the pre-reception control circuit may be integrated with those of the pre-transmission control circuit with the storage of transmission or reception command signals being dependent upon either read or write command signals from the common control in accordance with the mode of operation intended for the adapter. Again, however, to facilitate the description of each portion of the adapter, the components of the pre-reception control circuits have been separately illustrated and described. An explanation of their operation is contained in the subsequent description of the overall operation of the receiver portion of the adapter.

Dynamic Address Recognizer

As was described previously, in accordance with the present invention, each communications adapter to which a data frame is transmitted is selectively address-programmable into one of a plurality of address codes. A first of these is a unique address code which exclusively identifies a particular adapter port, so that one terminal may communicate exclusively with only one other terminal. Facility is also provided for assigning to a terminal an address which is common to, or shared by, at least one other terminal. This type of limited shared address is termed a group address. When a terminal desired to send a frame of data to a group or set of other terminals, it may assemble the frame so that the address byte identifies a group address code identifying that preselected group. In addition to limited group address identification, each terminal is assigned an address code termed a global address common to every other terminal in the system. This permits a terminal to communicate with every other terminal by encoding the address byte of a frame as the global address.

These plural address codes are set up in the terminal processor by software and loaded into respective address registers contained within the receiver hardward by the processor during initialization. This programmability feature of the adapter receiver permits dynamic changes in its address for monitoring and disassembling successive frames of data. This change may be initiated by a remote transmitting terminal which transmits instructions in the I field to tell the receiver's associated processor to change one or more of its associated adapter's addresses. The receiving terminal processor, during its data processing routine, will then proceed to cause a loading of a new one or set of receiver addresses in the adapter receiver storage hardward so that the adapter will be ready to monitor and receive a new frame of data from a transmitting terminal. A very useful application of this feature involves the changeability of groups to which adaptors may be assigned, as occasion demands.

As will be explained more fully below, when activated, the receiver portion of each adapter compares the address code of a monitored frame with the above described different types of address codes assigned to that particular adapter and, upon recognizing one of its assigned unique, group, or global address codes, proceeds to receive the remainder of the frame and couple received data to its associated processor and memory. For purposes of illustrating an exemplary embodiment of the invention, the description to follow will assume that an adapter may be assigned four address codes consisting of unique, global, and two separate group addresses, although the invention is not so limited, and a greater or lesser number of such addresses may be assigned to an adapter as the case demands.

Figure 9:
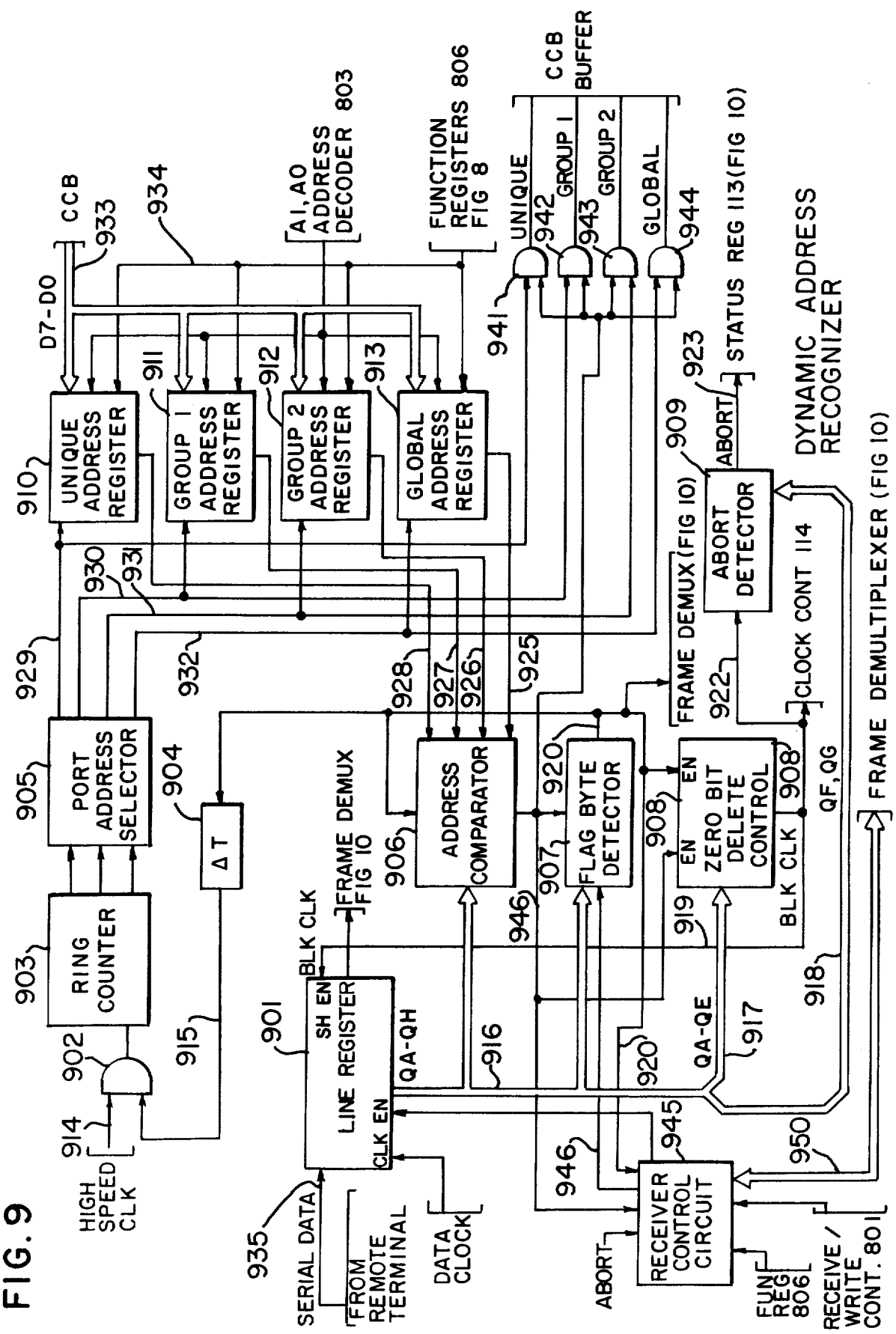
FIG. 9 shows the details of dynamic address recognition circuitry.

As described above, address codes assigned to a particular adapter may be supplied to its associated processor by software and coupled via the common control bus to respective port address registers of the adapter. For this purpose, as shown in FIG. 9, an adapter may comprise a unique address register 910, two group address registers 911 and 912, and a global address register 913. Each of address registers 910-913 is coupled to receive and store prescribed address codes via the data bits D7-D0 of the CCB, via line 933. The loading of the addresses to be employed by an adapter is effected by signals from address decoder 803 and function registers 806 of the pre-reception control circuit. The loaded contents of each address register are controllably scanned by port address selector 905, which sequentially causes the contents of the registers 910-913 to be coupled over lines 928-925 respectively, to an address comparator 906. Port address selector 905 is a decoder, inputs of which are derived from stages of ring counter 903. The outputs of selector 905 are coupled over lines 929-932 to registers 910-913, respectively, and to AND gates 941-945, respectively. Other inputs of gate 941-945 are obtained from address comparator 906. Ring counter 903 is clocked by a high speed clock via line 914 having a repetition rate sufficient to effect the scanning of register 910-913 within one data bit time. Ring counter 903 receives the high speed clock pulses via AND gate 902, which is enabled via line 915 and delay 904, subsequent to flag detection by flag byte detector 907. As a result, port address selector 905 decodes the shifting contents of counter 903 and sequentially causes the stored address contents of registers 910-913 to be supplied to address comparator 906 for comparison with the contents of line register 901. If an address match occurs, comparator 906 informs receiver control circuit 945 so that monitoring and demultiplexing of data can take place. Also, one of gates 941-944 will cause the appropriate address code to be identified for use by the associated processor.

Figure 11:
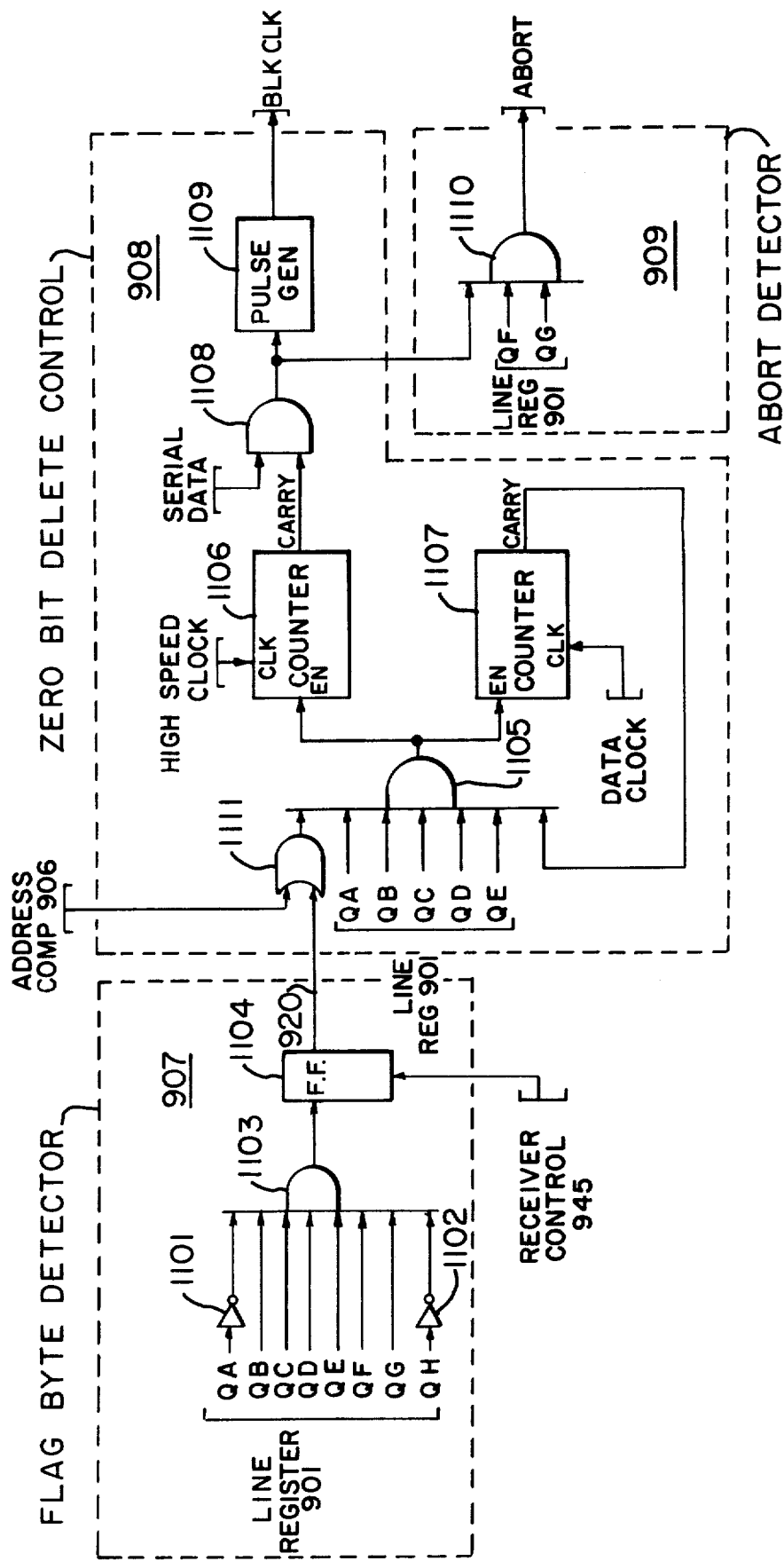
FIG. 11 shows, in detail, the constituents of the flag byte detector, zero bit delete control, and abort detector circuits of the frame demultiplexer.

Flag byte detector 907, the details of which are shown in FIG. 11 to be described subsequently, is coupled to the eight parallel outputs QA-QH of line register 901 and looks for the occurrence of a flag byte in register 901. Whenever a flat byte (0111 1110) is detected, flag byte detector 907 generates an output on line 920. Resetting of the flag byte detector is controlled by reset line 946 from receiver control circuit 945, which resets the flag byte detector after the flag byte has been detected. Line register 901 is coupled to the communication link from the remote transmitting adapter and receives the serial data stream in line 935. By a separate timing circuit (not shown) the bit timing of the received data stream is established for clocking various components of the adapter receiver, including line register 901. As data is received, it is serially shifted through line register 901 and supplied to shift register 100 in the frame demultiplexer.

The parallel contents of the QA-QH (eight bits) stages of register 901, in addition to being supplied to flag detector 907, are coupled over line 916 to address comparator 906 and zero bit delete control circuit 908 and abort detector 909. Only bits QA-QE are coupled to zero bit delete control circuit 908, while bits QF and QG are coupled to abort detector 909. The details of zero bit delete control circuit 908 and abort detector 909 are also shown in FIG. 11. The output of flag byte detector 907 is coupled to the enable inputs of address comparator 906 and zero bit delete control circuit 908 as well as receiver control circuit 945. Receiver control circuit 945 consists of straight forward combinational logic for supplying appropriate control or enabling signals to various components of the receiver as will be explained. For purposes of simplification, rather than describe the details of various gates and their interconnections of which control circuit 945 may be comprised, the description will treat the operational sequence of events which take place in the adapter, from which sequence control circuitry may be readily implemented. Receiver control circuit 945 is coupled to function registers 806 and receive/write control circuit 801 within the pre-reception control circuitry and is also coupled via lines 950 to frame demultiplexing components. Receiver control circuit 945 is coupled to the output of flag byte detector 907 and address comparator 906 and to the enable input of line register 901. Zero bit delete control circuit 908 generates a block clock signal BLK CLK which is supplied to various components of the adapter to inhibit clocking for one bit time, upon the detection of an inserted dummy zero bit in the incoming serial data stream. By inhibiting clocking, or serial shifting, zero bit delete control circuit 908 effectively destroys that bit in the data stream supplied to line register 901 during the bit inhibit period, so that inserted dummy zeroes are deleted. An explanation of the operation of the dynamic address recognizer circuitry shown in FIG. 9 is contained in the subsequent description of the operation of the overall receiver to follow.

Frame Demultiplexer

Figure 10:
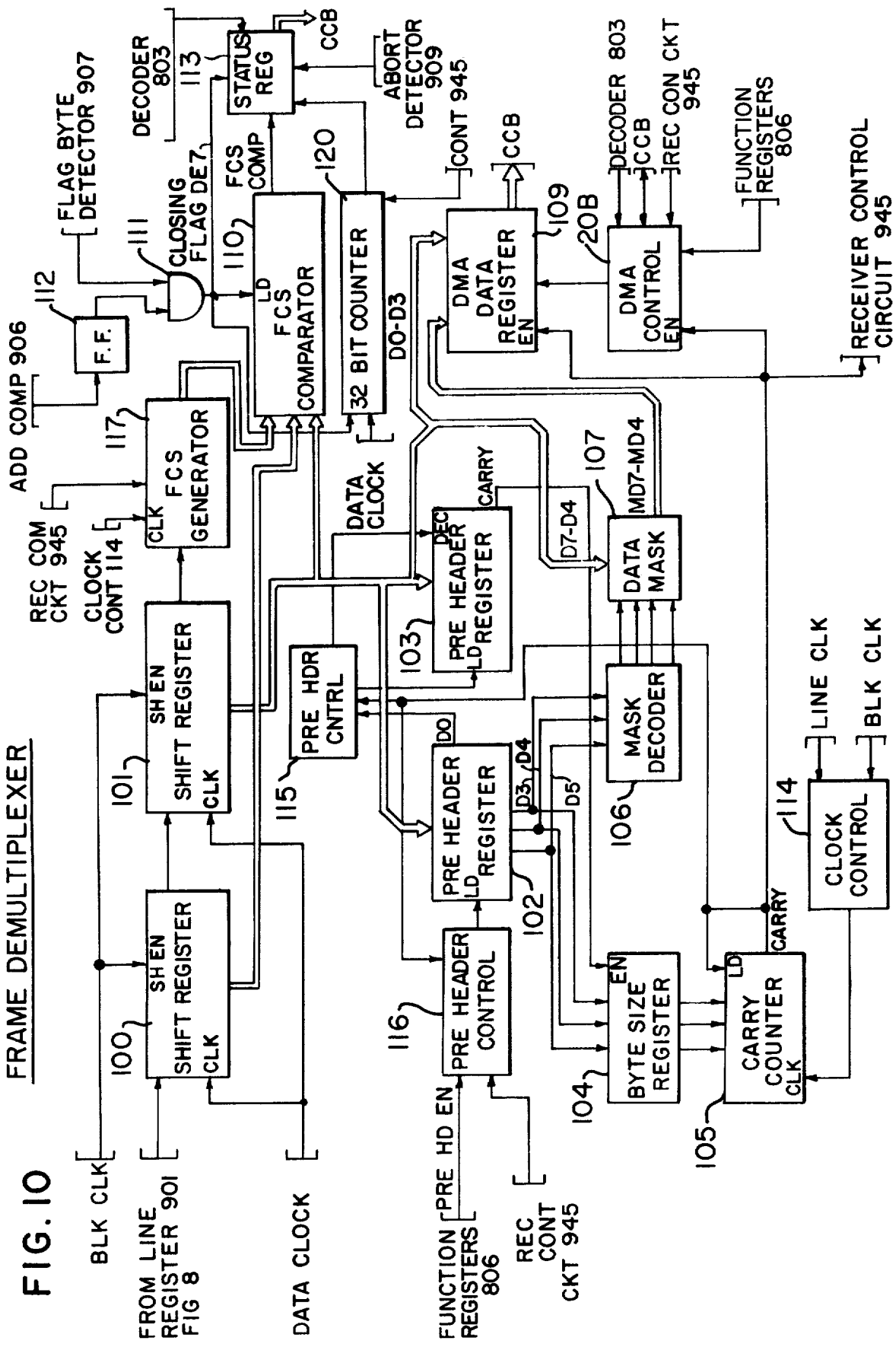
FIG. 10 illustrates frame demultiplexing and disassembly circuitry of the receiver portion of the adapter.

The frame demultiplexer circuitry, shown in FIG. 10, carries out the separation of the incoming data stream into the prescribed bytes to be stored in the memory associated with the adapter through DMA. The frame demultiplexer also contains circuitry for monitoring the length of the received frame and for generating a frame check sequence character in accordance with the received data and for comparing the internally generated FCS character with that transmitted from the remote adapter, so that the accuracy of the received data may be determined.

As was described previously, the serial data stream shifted through the line register 901 is supplied to shift register 100, Register 100 is an eight bit serial-in, serial-/parallel-out register as is the register 101, connected to receive the serial output of shift register 100. The serial output of shift register 101 is coupled to an FCS generator 117 which generates an FCS character in accordance with the contents of the received serial data stream less deleted dummy zero bits. The contents of the stages of registers 100 and 101 are coupled to FCS comparator 110 which also receives the contents of FCS generator 117. The loading of the FCS comparator 110 is controlled by the output of AND gate 111, inputs of which are coupled to flip-flop 112 and flag byte generator 907. Flip-flop 112 is set upon the generation of a match output from address comparator 906. When flag byte detector 907 generates an output subsequent to an address match output from comparator 906, AND gate 111 recognizes this as the detection of a closing flat byte and causes the contents of registers 100 and 101, which now contain the sixteen bit received FCS character, and the contents of FCS generator to be loaded into comparator 110. The output of FCS comparator is coupled to status register 113. The contents of shift register 101 are also coupled to pre-header registers 102 and 103, while selected portions of the contents of register 101 are coupled to dara register 109 and data mask circuit 107.

Each of pre-heater registers 102 and 103 is controlled by a respective pre-header control circuit 116 and 115 which operate in substantially the same manner as in the adapter transmitter described above. Selected bit outputs (D3, D4, D5) of pre-header register 102 are coupled to byte size register 104 which loads the contents of register 102 in response to a carry signal from pre-header register 103. As in the transmitter portion of the adapter, pre-header register 103 is formed of a down-counter and is loaded with the count byte, or second pre-header byte.

The contents of byte size register 104 are coupled to carry counter 105 which, like carry counter 400, described previously, counts from the binary number loaded from register 104 up through the three bit number (111) and recycles to the binary number provided on its inputs. The data clock pulses which control carry counter 105 are obtained from clock control circuit 114, which receives the serial line clock and the BLK CLK signal from zero bit delete control circuit 908.

The D5, D4, and D3 bits of pre-header register 102 which designate the byte size of the words of the data field are also coupled to mask decoder circuit 106. Mask decoder circuit 106 decodes the two's complement binary number contained in the D5, D4, and D3 stages of pre-header register 102 and causes data mask circuit 107 to selectively modify the contents of the D7-D4 bits from shift register 101 in dependence upon the byte size of data to be written into memory. These modified data bits MD7-MD4 are supplied together with the four LSBs of shift register 101 to DMA data register 109. DMA data register 109 stores each separated data byte as it is obtained from shift register 101 for storage in memory through DMA control circuit 108.

DMA control circuit 20B, like DMA control circuit 20A in the (adapter transmitter, contains a high address register, a low address register, a DMA word count register, and DMA control logic. During initialization, the sixteen bits of the starting address in memory where received data is to be written are stored in the DMA high and DMA low address registers. Each time a word in DMA data register 109 is stored, the contents of the DMA word count register and the DMA address registers are appropriately incremented so that each byte of received data is sequentially loaded in memory under DMA control and upon completion of storage a count of the total number of memory address locations containing data is available to the CCB.

As was described earlier, commonality of circuitry components in the transmitter and receiver portions of the adapter affords functional circuit integration. In addition, duplex operation is achieved by dedicating shared components on a first-come, first-served basis. Thus, the DMA control circuitry may be assessed for reading the data frame from memory during transmission mode, or for writing a received frame of data during reception mode. Control is provided by the associated processor which inhibits access of the DMA control for a requesting mode until the in-serivce mode has completed operation. This permits DMA control circuits 20A and 20B to be effectively constructed of one circuit, as shown in FIG. 6, selectively operated during one of the transmission or reception modes of the adapter. The carry output of the DMA word count register within DMA control 20B is also coupled to status register 113 to cause the latching of an overflow error signal should the frame demultiplexer attempt to access more than the two hundred fifty-six memory addresses (assuming an eight bit memory capacity) for which the system is designed.

Status register 113 is also connected to other components of the adapter to store appropriate status signals representative of the adapter operation for use by the common control.

Before explaining the overall operation of the receiver portion of the adapter, the details of the flag byte detector 907, zero bit delete control circuit 908, and abort detector 909, shown in FIG. 11, will be described.

Flag Byte Detector

As shown in FIG. 11, flag byte detector 907 consists of an AND gate 1103, two inputs of which are coupled through inverters 1101 and 1102 to the QA and QH stages of line register 901. The other inputs of AND gate 1103 are connected directly to the QB–QG outputs of line register 901. The output of AND gate 1103 is connected to flip-flop 1104. Whenever the contents QA–QH of line register 901 correspond to the binary character 0111 1110, AND gate 1103 is enabled to cause flip-flop 1104 to be set. The output of flip-flop 1104 is coupled to line 920, enabling address comparator circuitry and zero bit delete control circuit 908, until reset by carry counter 105. Flip-flop 1104 is reset by receiver control circuit 945.

Zero Bit Delete Control

Zero bit delete control circuit 908 includes an AND gate 1105, one input of which is coupled to line 920 from flag byte detector 907 or address comparator 906, via OR gate 1111. The QA–QE stages of line register 901 are also supplied as inputs to AND gate 1105 along with the output of a six-bit counter 1107. Counter 1107 receives the serial data clock and counts clock pulses when enabled by the output of AND gate 1105. The output of AND gate 1105 is also coupled to the enable input of a sixteen bit counter 1106 which counts high speed clock pulses. The carry output of counter 1106 is connected to one input of AND gate 1108, the other input of which receives the incoming serial data system. The output of AND gate 1108 is connected to pulse generator 1109 which generates a BLK CLK pulse for one data bit time.

Zero bit delete control circuit 908 is initially enabled upon the reception of a flag byte and then, if the adapter recognizes its address, it continues to monitor the received data stream until the final flag byte. Should AND gate 1105 detect five consecutive one bits being serially clocked into stages QA–QE of line register 901, it enables counters 1106 and 1107. Counter 1106 reaches a carry of a sixteen count during the sixth data bit QF. Counter 1107 is loaded with the two's complement of six and inhibits the zero deletion operation during the following bit time. AND gate 1108 looks at the next bit, i.e. QF, to determine whether a zero bit deletion is required or if an abort may follow. If QF is a zero bit, pulse generator 1109 generates a BLK CLK pulse to inhibit loading of the next data bit into line register 901. Other shift clocking and counting circuitry is also temporarily disabled so that the dummy zero bit will not be processed as true data.

If QF is not a zero bit, AND gate 1110 looks at the next bit or seventh bit QG. If QG is a zero bit, the adapter will have recognized a flat. If QG is a one bit, it is assumed that an abort character (11111111) has been received and an abort condition is signalled by AND gate 1110. The receiver is then reset by the control circuitry and an abort status condition is stored in status register 113. Interrupt is then applied via the CCB to the processor.

Receiver Operation

The operation of the receiver portion of the adapter will be described with reference to FIGS. 8 through 11 for an exemplary frame of transmitted data having an information field (I field) with a change in byte size of the data from the normal eight bits/byte length to the five bits/byte length given previously in conjunction with the description of data transmission.

Initialization

Under normal conditions, unless a communication adapter has been selectively initialized to transmit data, it will have been placed in the receive mode by the common control, to monitor the line for an incoming communication. For this purpose, the terminal procesor will supply a set of address, data, and control signals on the CCB, as takes place during the initializing of an adapter for transmitting data.

The adapter is placed in the receive mode via write command and enable control signals for the control bus supplied to receive/write control circuitry 801. Address bits A7–A2 on lines 841 identifying the port address of the adapter are compared with the address bits A7–A2 supplied from the common control over lines 840 from the CCB. Upon recognizing its port address, comparator 804 generates an "address match" signal on line 842 to enable the decoder which decodes the two least significant bits A1, A0 of the address bus portion of the CCB. As is the case with the transmitter portion of the adapter, the operations carried out by the components of the pre-reception control circuit will depend upon the binary states of bits A1 and A0. The processor first supplies a "1" as the A0 bit and a "0" as the A1 bit causing decoder 803 to enable function register selector 805 to decode bits D2–D0 on line 851 and selectively cause the contents of bits D7–D3 to be latched into function registers 806 so that the necessary command and control signals for operating the receiver circuitry are stored in registers 806. Next, the processor supplies a "1" as the A0 bit and a "1" as the A1 bit, causing decoder 803 to load address registers 910-913 with their respective unique, group 1, group 2, and global port address codes supplied over the data bus portion of the CCB. In addition, detection of (A1, A0) as (11) causes decoder 803 to enable status register 113 to load status commands and the high and low address registers of DMA control 20B are loaded with the starting memory address for DMA storage and the DMA word count register is readied. Once these adapter receiver initializing conditions have been established, the receiver portion of the adapter is ready to monitor the serial data line for data.

Flag Byte Detection

As the receiver is monitoring the serial data line input 935 to the line register 901 it will continuously look for a flag byte with which each frame of data begins, since flag byte detection is a prerequisite to further action. Upon detecting the flag code (0111 1110) in the QA-QH stages of line register 901, flag byte detector 907 generates a flag detected signal on output line 920. The receiver is set up to assume that the next byte is an address byte and address detection is enabled by the flag detected signal on line 920 coupled to the enable input of address comparator 906. In addition, the flag detected signal is delayed by delay circuit 904 and enables AND gate 915, so that high speed clock pulses in line 914 may be coupled to ring counter 903. The output of flag byte detector is also coupled to zero bit delete control circuit 908, receive control circuit 945, and one input AND gate 111 of the frame demultiplexer; the other input of gate 111 is disabled since no comparison of an address byte and the contents of one of registers 910-913 has been effected.

Address Comparison

As the next byte (the address byte) following the flag byte is received, it is clocked into line register 901, the QA-QH stage contents of which are coupled to now enabled address comparator to be compared with the sequentially scanned contents of registers 910-913. As ring counter counts the high speed clock pulses, its contents are decoded by port address selector 905 to sequentially cause the address code contents of registers 910-913 to be applied over lines 928-925 for comparison with the contents of the line register. Ring counter 903 recycles on each fifth high speed clock pulse counted so that it causes a repetition scan of the four registers 910-913. When there is a match between the QA-QH contents of register 901 and one of the registers 910-913, that one of AND gates 941-944 connected to the address register being selected by port address selector 905 at the time will be enabled to cause a latching of the address recognized for status purposes. If the address byte clocked into line register 901 fails to match one of the address codes stored in registers 910-913, flag byte detector is reset so that the adapter begins again to monitor the line for a new communication and flag byte.

As was described previously, the contents of the address registers 910-913 are defined during adapter receiver initialization, and may be varied from frame to frame. Where the contents of a received information (I) field, the disassembly of which is described below, contain instructions directing the receiving terminal to change an address code, such as one of the group addresses, the processor, after processing data in this frame, may then proceed to prepare the adapter for an address change. In the present example, a group change will result in a storage of a different address code in one of group address register 911 and 912 during initialization. As a confirmation of the address change to the change directing transmitting terminal, the adapter is placed in the transmit mode, and sends address change acknowledgement data in its own transmitted I field to the remote terminal. The terminal directing the address change, having been advised of the address change, then proceeds to format a new data frame containing the new address field previously requested so that, at the receiver, during address comparison, the address field will be recognized as the new code stored in one of registers 911 and 912, and frame disassembly can proceed.

ADDRESS AND CONTROL FIELD DISASSEMBLY

Assuming that address comparator has recognized the address byte matching one of the address codes of registers 910-913, then receiver control circuit 945, in response to the address recognition signal on line 946, proceeds to enable FCS generator 117 after timing out the shift of the flag byte through register 101. It also enables thrity-two bit counter 120 so that the check on the minimum acceptable frame bit count can proceed.

During the clocking of the received data stream through shift registers 100 and 101, carry counter 105 continues to generate carry signals for each initial eight-bit byte until its contents are modified by byte size register 104. Data to be loaded into memory is extracted from the parallel output lines of the eight stages of shift refister 101 under control of the carry signal from counter 105 and supplied to DMA data register 109. The four least significant bits D0-D3 are applied directly to register 109 while the four MSBs, which may be masked, in the event of a byte size change, are coupled through data mask logic 107 to register 109. Until there is a change in byte size, data mask logic 107 does not modify the four MSBs from shift register 101, so that DMA control circuit 20B couples all eight bits from shift register 101 to memory, and increments its DMA address and word count registers, as described previously.

I Field Dissassembly

After the control field has been coupled through shift register 101, receiver control circuit 945 enables pre-header control circuit 116, so that the first or leading pre-header byte (indicating the presence and degree of a data byte size change) will be loaded from the eight stage of shift register 101 into pre-header register 102. Assuming a data byte size change, the D0 bit in register 102 will be a "0" so that pre-header control is enabled, causing the subsequent loading of pre-header register 103 at the next carry signal from counter 105, namely, upon the second pre-header or count byte being present in shift register 101. Like the previous data, the pre-header bytes are also supplied to data mask logic 107 and register 109 to be written into memory by DMA. Thus, as carry counter 105 continues to generate a carry signal for each eight data clock pulses counted, the contents of the I field are separated and loaded into memory, as eight bit bytes, by DMA control 20B.

At the same time, the contents of pre-header register 103 are decremented until it generates a carry, indicating that the last of the eight bit bytes of the I field has been supplied through shift register 101 for DMA loading into memory. The carry signal from register 103 enables byte size register 104 so that carry counter 105 receives a new set of inputs. For the example chosen, the bytes $D5 \times 0$, $D4 = 1$, $D3 = 1$, are supplied to carry counter 105, so that it now generates a carry for every five clock pulses counted. This means that the last eight bit byte of the I field will not be completely shifted out of shift register 101 at the next carry signal from counter 105. Three bits of the last eight bit byte will occupy the D7, D6, and D5 positions in shift register 101. However, mask decoder 106 decodes the D3, D4, and D5 contents of register 102 as indicating a change in byte size from an eight bit byte to a five bit byte. The outputs of mask decoder 106 are coupled to data mask logic 107 to mask the D7, D6, and D5 bits from shift register 101, so that DMA control 20B now loads only the four bits D0–D3 from register 101, and the fifth bit, D4, (unmasked) as a five bit byte. For the next and each subsequent five bit count by carry counter 105, the process is repeated until the last five bit byte of the I field has been clocked out through shuift register 101.

FRAME CHECK SEQUENCE COMPARISON

Upon the last five bit byte of the I field having been clocked out through shift register 101, then in accordance with the frame format of FIG. 2, shift register 101 will now contain the first eight bits of the sixteen bit FCS field, while shift register 100 will contain the second eight bits of the sixteen bit FCS field. Also, line register 901 will contain a closing flag byte. Flag byte detector supplies a flag detected signal to AND gate 111 which is now enabled since flip-flop 112 was set by address comparator 306, causing the FCS character in FCS generator 117 to be loaded and compared with the contents of shift registers 100 and 101. The result of this comparison is supplied to status register 113. If the FCS characters match, the FCS character is loaded in memory by DMA, the system is reset and an end of frame interrupt condition is supplied to the processor; otherwise, an error condition is latched by register 113.

MINIMUM FRAME LENGTH CHECK

As a further diagnostic check as to the correctness of the received frame thirty-two bit counter 120 is enabled to examine the minimum acceptable length of a frame of data. As was pointed out previously, subsequent to the address field, each frame of data will contain at least an eight bit control field, a sixteen bit frame check sequence field and a closing eight bit flag byte, for a total of thirty-two bits. Of course, if an I field is included in the frame, its bit length will increase. Counter 120 is enabled by control circuit 945 once an adapter recognizes its address in the address field of the monitored frame. Should a closing flag byte be detected prior to the contents of counter 120 reaching a count of thirty-two, counter 120 will supply an error signal to status register 113 to advise the processor of an invalid frame.

As will be appreciated from the foregoing description, the communications adapter in accordance with the present invention provides a versatile technique of assembling a serially arranged data stream for transmission to a remote terminal, and subsequent decoding and disassembling of the data stream at each remote terminal to which the communication is addressed. By virtue of the chosen characteristics of prescribed portions of the data stream and implementing hardware, the byte size of the serial stream may be altered during transmission, permitting a more efficient and rapid transmission of the serial data. A change in the byte size is recognized at the receiver so that proper dissassembly of the serial stream into its encoded data characters can be effected.

While we have shown and described one embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A method of controlling the transmission and reception of a frame of data in serial format, from a first processing terminal to at least one second processing terminal, respectively, comprising the steps of:

generating and transmitting at said first processing terminal, a sequence of groups of signals containing an address code identifying said at least one second processing terminal to which a data transmission is directed, prescribed control information, and data to be received by said at least one second processing terminal, respectively; and within the group of signals containing the data to be received by said at least one second processing terminal, selectively generating
   (i) a first sequence of signals representative of whether there is to be a change in the length of the data words,
   (ii) a second sequence of signals representative of the number of data words prior to the occurrence of a word length change, and
   (iii) a third sequence of signals containing each of said data words and address code change request data;

receiving, at said at least one second processing terminal, the sequence of groups of signals transmitted by said first processing terminal and, upon recognizing that the address code contained within said sequence of groups of signals identifies said at least one second processing terminal, causing said sequence of groups of signals to be disassembled in accordance with any change in data word size as represented by said first and second sequences of signals;

generating and transmitting, at said first processing terminal, a first group of signals representative of a prescribed function of said sequence of groups of signals;

generating and transmitting, at said first processing terminal, a pair of groups of flag signals each of which uniquely identifies an end point of a frame of data;

so that each frame of data transmitted from said first processing terminl to said at least one second processing terminal is comprised of an initial flag signal group, a sequence of address, control, and data signal groups, a prescribed function signal group, and a terminating flag signal group, a sequence of address, control, and data signal groups, a prescribed functional signal group, and a terminating flag signal group at said at least one second processing terminal, monitoring signals from a first processing terminal and, upon detecting an initial flag signal group, comparing the address signal group with at least one receiver address code identifying said at least one second processing terminal to determine whether or not the signals from a first processing terminal are being directed to said at least one second processing terminal; and at said at least one second processing terminal, modifying said at least one receiver address code identifying said at least one second processing terminal, so that for a subsequently received frame of data, the address signal group transmitted from said first processing terminal will be compared with a new receiver address code identifying said at least one second processing terminal.

2. A method of controlling the transmission and reception of a frame of data in serial format, from a first processing terminal to at least one second processing terminal, respectively, comprising the steps of:

generating and transmitting at said first processing terminal, a sequence of groups of signals containing an address code identifying said at least one second processing terminal to which a data transmission is directed, prescribed control information, and data to be received by said at least one second processing terminal, respectively;

within the group of signals containing the data to be received by said at least one second processing terminal, selectively generating (i) a first sequence of signals representative of whether there is to be a change in the length of the data words, (ii) a second sequence of signals representative of the number of data words prior to the occurrence of a word length change, and (iii) a third sequence of signals containing each of said data words;

receiving, at said at least one second processing terminal, the sequence of groups of signals transmitted by said first processing terminal and, upon recognizing that the address code contained within said sequence of groups of signals identifies said at least one second processing terminal, causing said sequence of groups of signals to be disassembled in accordance with any change in data word size as represented by said first and second sequences of signals;

generating and transmitting, at said first processing terminal, a first groups of signals representative of a prescribed function of said sequence of groups of signals;

generating and transmitting, at said first processing terminal, a pair of groups of flag signals each of which uniquely identifies an end point of a frame of data;

so that each frame of data transmitted from said first processing terminal to said at least one second processing terminal is comprised of an initial flag signal group, a sequence of address, control, and data signal groups, a prescribed function signal group, and a terminating flag signal group at said at least one second processing terminal;

monitoring signals from a first processing terminal and, upon detecting an initial flag signal group, comparing the address signal group with at least one receiver address code identifying said at least one second processing terminal to determine whether or not the signals from a first processing terminal are being directed to said at least one secured processing terminal;

also at said at least one second processing terminal, selectively separating a received frame of data into its respective signal groups and generating a second group of signals representative of a preselected function of the received sequence of groups of signals; and comparing the first group of signals representative of said prescribed function of said sequence of groups of signals transmitted from a first processor terminal with said second group of signals representative of said preselected function of the received sequence of groups of signals, whereby the correlation of the received frame with that transmitted can be determined.

3. A method according to claim 2, further comprising the steps of, at said at least one second processing terminal, detecting said terminating flag signal group and thereby detecting the termination of a received frame of data.

4. A method according to claim 2, further comprising the step of, at said at least one second processing terminal, monitoring the length of the frame of data and generating an invalid frame indicating signal upon recognition of a terminating flag signal group prior to the length of the monitored frame of data reaching a preselected value.

5. A method of controlling the transmission and reception of a frame of data in serial format, from a first processing terminal to at least one second processing terminal, respectively, comprising the steps of:

generating and transmitting at said first processing terminal, a sequence of groups of signals containing an address code identifying said at least one second processing terminal to which a data transmission is directed, prescribed control information, and data to be received by said at least one second processing terminal, respectively; and within the group of signals containing the data to be received by said at least one second processing terminal, selectively generating (i) a first sequence of signals representative of whether there is to be a change in the length of the data words, (ii) a second sequence of signals representative of the number of data words prior to the occurrence of a word length change, and (iii) a third sequence of signals containing each of said data words; and receiving, at said at least one second processing terminal, the sequence of groups of signals transmitted by said first processing terminal and, upon recognizing that the address code contained within said sequence of groups of signals identifies said at least one second processing terminal, causing said sequence of groups of signals to be dissassembled in accordance with any change in the data word size as represented by said first and second sequences of signals;

generating and transmitting, at said first processing terminal, a first group of signals representative of a prescribed function of said sequence of groups of signals;

generating and transmitting, at said first processing terminal, a pair of groups of flag signals each of which uniquely identifies an end point of a frame of data;

so that each frame of data transmitted from said first processing terminal to said at least one second processing terminal is comprised of an initial flag signal group, a sequence of address, control and data signal groups, a prescribed function signal group, and a terminating flag signal group;

at said first processing terminal, selectively modifying said sequence of groups of signals and said first group of signals so as to prevent the frame of data from containing groups of signals corresponding to said flag signals other than at those portions of a data frame where flag signals are intended to occur, and at said at least one second processing terminal, detecting the occurrence of any selective modification of the sequence of groups of signals and said first group of signals transmitted from a first processing terminal and removing said selective modification thereof so as to permit accurate disassembly of a frame of data received at said at least one second processing terminal.

6. A method according to claim 5, further comprising the steps of, at said first processing terminal, generating an abort character made up of a prescribed group of signals representative of the aborting of a frame, in response to the occurrence of prescribed conditions, and transmitting said abort character to said at least one second processing terminal, and at said at least one second processing terminal, detecting an abort character transmitted from a first processing terminal and thereby terminating frame reception.

7. A method according to claim 6, wherein the generation and transmission of an abort character at a first processing terminal comprises the generation and transmission of a unique group of signals as an abort character while inhibiting the selective modification of said sequence of groups of signals and said first group of signals.

8. A method of controlling the transmission and reception of a frame of data in serial format, from a first processing terminal to at least one second processing terminal, respectively, comprising the steps of:

generating and transmitting at said first processing terminal, a sequence of groups of signals containing an address code identifying said at least one second processing terminal to which a data transmission is directed, prescribed control information, and data to be received by said at least one second processing terminal, respectively; and within the group of signals containing the data to be received by said at least one second processing terminal, selectively generating (i) a first sequence of signals representative of whether there is to be a change in the length of the data words, (ii) a second sequence of signals representative of the number of data words prior to the occurrence of a word length change, and (iii) a third sequence of signals containing each of said data words; and receiving, at said at least one second processing terminal, the sequence of groups of signals transmitted by said first processing terminal and, upon recognizing that the address code contained within said sequence of groups of signals identifies said at least one second processing terminal, causing said sequence of groups of signals to be disassembled in accordance with any change in data word size as represented by said first and second sequences of signals;

generating and transmitting, at said first processing terminal, a first group of signals representative of a prescribed function of said sequence of groups of signals;

generating and transmitting, at said first processing terminal, a pair of groups of flag signals each of which uniquely identifies an end point of a frame of data;

so that each frame of data transmitted from said first processing terminal to said at least one second processing terminal is comprised of an initial flag signal group, a sequence of address, control, and data signal groups, a prescribed function signal group, and a terminating flag signal group;

at said first processing terminal, generating an abort character made up of a prescribed group of signals representative of the aborting of a frame in response to the occurrence of prescribed conditions, and transmitting said abort character to said at least one second processing terminal, and at said at least one second processing terminal, detecting an abort character transmitted from a first processing terminal and thereby terminating frame reception.

9. A data communication system for controlling the transmission and reception of a frame of data in serial format, from a first processing terminal whereat data to be transmitted is read out from a selectively addressable memory, said frame being comprised of a sequence of signal containing address, control, and data information fields, to at least one second processing terminal whereat received data is written into a selectively addressable memory, comprising:

at said first processing terminal, first means for generating a first sequence of groups of signals containing the address of said at least one second processing terminal to which the transmission of a frame of data is directed, and prescribed control information, respectively, second means for accessing the selectively addressable memory and generating a second sequence of groups of signals respectively representative of whether there is to be a change in the length of the data words, the number of data words prior to the occurrence of a word length change, and the words containing the data information, and third means, coupled to said first and second means, for sequentially transmitting said first and second sequences of groups of signals to said at least one second processing terminal, and at said at least one second processing terminal, fourth means for monitoring signals transmitted by a first processing terminal and generating an output upon recognizing that the first sequence of groups of signals contains an address corresponding to said at least one second processing terminal, and fifth means, coupled to said fourth means, for causing a frame of data read out of memory and transmitted by said first processing terminal to be disassembled and written into memory at said second processing terminal in accordance with any change in data word size as represented by said second sequence of signals;

sixth means, coupled to said first and second means, for generating a group of signals representative of a prescribed function of said first and second sequences of groups of signals and supplying said prescribed function representative group of signals to said third means for transmission subsequent to the transmission of said second sequence of groups of signals;

seventh means, coupled to said third means, for generating a pair of groups of flag signals, each of which uniquely identifies an end point of a frame of data, and supplying one of said groups of flag signals to said third means for transmission prior to the transmission of said first sequence of groups of signals and the other of said groups of flag signals to said third means for transmission subsequent to the transmission of said prescribed function representative group of signals, so that a complete frame of data transmitted by said first processing terminal to said at least one second processing terminal is comprised of a sequential arrangement of said one of said groups of flag signals, said first sequence, said second sequence, said prescribed function representative group, and the other of said groups of flag signals; and said fourth means including means for comparing the address containing signal group with at least one receiver address code identifying said at least one second processing terminal, upon detection of said one flag signal group, to determine whether or not a frame of data transmitted from a first processing terminal is being directed to said at least one second processing terminal.

10. A data communication system according to claim 9, wherein the data information within said second sequence of groups of signals transmitted from said first processing terminal contains address code change request data and said fourth means includes means for storing at least one changeable address code identifying said second processing terminal, the address code stored in which is modified in accordance with said address code change request data, whereby, for a subsequently received frame of data, the address signal group transmitted from said first processing terminal will be compared with a new receiver address code identifying said at least one second processing terminal.

11. A data communication system according to claim 9, further comprising, at said at least one second processing terminal,
  eighth means, coupled to said fourth and fifth means, for generating a group of signals representative of a preselected function of the received first and second sequences of groups of signals, and
  ninth means, coupled to said eighth means and said fifth means, for comparing the prescribed function representative group of signals transmitted from said first processing terminal with said preselected function representative group of signals generated by said eighth means, whereby the correlation of the received frame with that transmitted can be determined.

12. A data communication system according to claim 9, further comprising, at said at least one second processing terminal, eighth means, coupled to said fourth means, for detecting said other of said groups of flag signals and generating an output representative of the termination of a received frame of data.

13. A data communication system for controlling the transmission and reception of a frame of data in serial format, from a first processing terminal whereat data to be transmitted is read out from a selectively addressable memory, said frame being comprised of a sequence of signals containing address, control, and data information fields, to at least one second processing terminal whereat received data is written into a selectively addressable memory, comprising:
  at said first processing terminal,
    first means for generating a first sequence of groups of signals containing the address of said at least one second processing terminal to which the transmission of a frame of data is directed, and prescribed control information, respectively,
    second means for accessing the selectively addressable memory and generating a second sequence of groups of signals respectively representative of whether there is to be a change in the length of the data words, the number of data words prior to the occurrence of a word length change, and the words containing the data information, and
    third means, coupled to said first and second means, for sequentially transmitting said first and second sequences of groups of signals to said at least one second processing terminal, and
  at said at least one second processing terminal,
    fourth means for monitoring signals transmitted by a first processing terminal and generating an output upon recognizing that the first sequence of groups of signals contains an address corresponding to said at least one second processing terminal, and
    fifth means, coupled to said fourth means, for causing a frame of data read out of memory and transmitted by said first processing terminal to be disassembled and written into memory at said second processing terminal in accordance with any change in data word size as represented by said second sequence of signals;
  sixth means, coupled to said first and second means, for generating a group of signals representative of a prescribed function of said first and second sequences of groups of signals and supplying said prescribed function representative group of signals to said third means for transmission subsequent to the transmission of said second sequence of groups of signals;
  seventh means, coupled to said third means, for generating a pair of groups of flag signals, each of which uniquely identifies an end point of a frame of data, and supplying one of said groups of flag signals to said third means for transmission prior to the transmission of said first sequence of groups of signals and the other of said groups of flag signals to said third means for transmission subsequent to the transmission of said prescribed function representative group of signals, so that a complete frame of data transmitted by said first processing terminal to said at least one second processing terminal is comprised of a sequential arrangement of said one of said groups of flag signals, said first sequence, said second sequence, said prescribed function representative group, and the other of said groups of flag signals; and
  eighth means, coupled to said fourth means, for monitoring the length of the frame of data and generating an invalid frame indicating signal upon recognition of said other flag signal group prior to the length of the monitored frame of data reaching a preselected value.

14. A data communication system for controlling the transmission and reception of a frame of data in serial format, from a first processing terminal whereat data to be transmitted is read out from a selectively addressable memory, said frame being comprised of a sequence of signals containing address, control, and data information fields, to at least one second processing terminal whereat received data is written into a selectively addressable memory, comprising:

at said first processing terminal, first means for generating a first sequence of groups of signals containing the address of said at least one second processing terminal to which the transmission of a frame of data is directed, and prescribed control information, respectively, second means for accessing the selectively addressable memory and generating a second sequence of groups of signals respectively representative of whether there is to be a change in the length of the data words, the number of data words prior to the occurrence of a word length change, and the words containing the data information, and third means, coupled to said first and second means, for sequentially transmitting said first and second sequences of groups of signals to said at least one second processing terminal, and at said at least one second processing terminal, fourth means for monitoring signals transmitted by a first processing terminal and generating an output upon recognizing that the fist sequence of groups of signals contains an address corresponding to said at least one second processing terminal, and fifth means, coupled to said fourth means, for causing a frame of data read out of memory and transmitted by said first processing terminal to be disassembled and written into memory at said second processing terminal in accordance with any change in data word size as represented by said second sequence of signals;

sixth means, coupled to said first and second means, for generating a group of signals representative of a prescribed function of said first and second sequences of groups of signals and supplying said prescribed function representative group of signals to said third means for transmission subsequent to the transmission of said second sequence of groups of signals;

seventh means, coupled to said third means, for generating a pair of groups of flag signals, each of which uniquely identifies an end point of a frame of data, and supplying one of said groups of flag signals to said third means for transmission prior to the transmission of said first sequence of groups of signals and the other of said groups of flag signals to said third means for transmission subsequent to the transmission of said prescribed function representative group of signals, so that a complete frame of data transmitted by said first processing terminal to said at least one second processing terminal is comprised of a sequential arrangement of said one of said groups of flag signals, said first sequence, said second sequence, said prescribed function representative group, and the other of said groups of flag signals;

eighth means, coupled to said third means, for selectively modifying said first and second sequences of groups of signals and said prescribed function representative group of signals so as to prevent a transmitted frame of data from containing groups of signals corresponding to said flag signals other than at those portions of a data frame where flag signals are intended to occur, and at said at least one second processing terminal, ninth means, coupled to said fourth means, for detecting the occurrence of any selective modification of said first and second sequences of groups of signals and said prescribed function representative groups of signals transmitted from a first processing terminal and removing said selective modification thereof so as to permit accurate disassembly of a frame of data by said fifth means.

15. A data communication system according to claim 14, further including, at said first processing terminal, tenth means, coupled to said third means, for generating an abort character made up of a prescribed group of signals representative of the aborting of a frame, in response to the occurrence of prescribed conditions, and supplying said abort character to said third means for immediate transmission to said at least one second processing terminal, and at said at least one second processing terminal, eleventh means, coupled to said fourth and fifth means, for detecting an abort character transmitted from a first processing terminal and terminating frame reception and disassembly in response thereto.

16. A data communication system according to claim 15, wherein said tenth means includes means for generating a unique group of signals as an abort character to be supplied to said third means for transmission while inhibiting the selective signal modification by said eighth means.

17. A data communication system for controlling the transmission and reception of a frame of data in serial format, from a first processing terminal whereat data to be transmitted is read out from a selectively addressable memory, said frame being comprised of a sequence of signals containing address, control, and data information fields, to at least one secoond processing terminal whereat received data is written into a selectively addressable memory, comprising:

at said first processing terminal, first means for generating a first sequence of groups of signals containing the address of said at least one second processing terminal to which the transmission of a frame of data is directed, and prescribed control information, respectively, second means for accessing the selectively addressable memory and generating a second sequence of groups of signals respectively representative of whether there is to be a change in the length of the data words, the number of data words prior to the occurrence of a word length change, and the words containing the data information, and third means, coupled to said first and second means, for sequentially transmitting said first and second sequences of groups of signals to said at least one second processing terminal, and at said at least one second processing terminal, fourth means for monitoring signals transmitted by a first processing terminal and generating an output upon recognizing that the first sequence of groups of signals contains an address corresponding to said at least one second processing terminal, and fifth means, coupled to said fourth means, for causing a frame of data read out of memory and transmitted by said first processing terminal to be disassembled and written into memory at said second processing terminal in accordance with any change in data word size as represented by said second sequence of signals;

sixth means, coupled to said first and second means, for generating a group of signals representative of a prescribed function of said first and second sequences of groups of signals and supplying said prescribed function representative group of signals to said third means for transmission subsequent to the transmission of said second sequence of groups of signals;

seventh means, coupled to said third means, for generating a pair of groups of flag signals, each of which uniquely identifies an end point of a frame of data, and supplying one of said groups of flag signals to said third means for transmission prior to the transmission of said first sequence of groups of signals and the other of said groups of flag signals to said third means for transmission subsequent to the transmission of said prescribed function representative group of signals, so that a complete frame of data transmitted by said first processing terminal to said at least one second processing terminal is comprised of a sequential arrangement of said one of said groups of flag signals, said first sequence, said second sequence, said prescribed function representative group, and the other of said groups of flag signals;

eighth means, coupled to said third means, for generating an abort character made up of a prescribed group of signals representative of the aborting of a frame, in response to the occurrence of prescribed conditions, and supplying said abort character to said third means for immediate transmission to said at least one second processing terminal, and at said at least one second processing terminal, ninth means, coupled to said fourth and fifth means, for detecting an abort character transmitted from a first processing terminal and terminating frame reception and disassembly in response thereto.

18. A method of controlling the transmission of a frame of data in serial format from a first processing terminal to at least one second processing terminal comprising the steps of:

generating and transmitting at said first processing terminal, a sequence of groups of signals containing an address code identifying said at least one second processing terminal to which a data transmission is directed, prescribed control information, and data to be received by said at least one second processing terminal, respectively; and within the group of signals containing the data to be received by said at least one second processing terminal, selectively generating (i) a first sequence of signals representative of whether there is to be a change in the length of the data words, (ii) a second sequence of signals representative of the number of data words prior to the occurrence of a word length change, and (iii) a third sequence of signals containing each of said data words;

generating and transmitting, at said first processing terminal, a first group of signals representative of a prescribed function of said sequence of groups of signals;

generating and transmitting, at said first processing terminal, a pair of groups of flag signals each of which uniquely identifies an end point of a frame of data;

so that each frame of data transmitted from said first processing terminal to said at least one second processing terminal is comprised of an initial flag signal group, a sequence of address, control, and data signal groups, a prescribed function signal group, and a terminating flag signal group;

at said first processing terminal;

selectively modifying said sequence of groups of signals and said first group of signals so as to prevent the frame of data from containing groups of signals corresponding to said flag signals other than at those portions of a data frame where flag signals are intended to occur, generating an abort character made up of a prescribed group of signals representative of the aborting of a frame, in response to the occurrence of prescribed conditions, and transmitting said abort character to said at least one second processing terminal.

19. A method according to claim 18, wherein the generation and transmission of an abort character at a first processing terminal comprises the generation and transmission of a unique group of signals as an abort character while inhibiting the selective modification of said sequence of groups of signals and said first group of signals.

20. A data communication system for controlling the transmission of a frame of data in serial format from a first processing terminal to at least one second processing terminal, said frame being comprised of a sequence of signals containing address, control, and data information fields, comprising:

at said first processing terminal, first means for generating a first sequence of groups of signals containing the address of said at least one second processing terminal to which the transmission of a frame of data is directed, and prescribed control information, respectively, second means for accessing the selectively addressable memory and generating a second sequence of groups of signals respectively representative of whether there is to be a change in the length of the data words, the number of data words prior to the occurrence of a word length change, and the words containing the data information;

third means, coupled to said first and second means, for sequentially transmitting said first and second sequence of groups of signals to said at least one second processing terminal;

fourth means, coupled to said first and second means, for generating a group of signals representative of a prescribed function of said first and second sequences of groups of signals and supplying said prescribed function representative group of signals to said third means for transmission subsequent to the transmission of said second sequence of groups of signals;

fifth means, coupled to said third means, for generating a pair of groups of flag signals, each of which uniquely identifies an end point of a frame of data, and supplying one of said groups of flag signals to said third means for transmission prior to the transmission of said first sequence of groups of signals and the other of said groups of flag signals to said third means for transmission;

sixth means, coupled to said third means, for selectively modifying said first and second sequences of groups of signals and said prescribed function representative group of signals so as to prevent a transmitted frame of data from containing groups of signals corresponding to said flag signals other than at those portions of a data frame where flag signals are intended to occur; and seventh means, coupled to said third means, for generating an abort character made up of a prescribed group of signals representative of the aborting of a frame, in response to the occurrence of prescribed conditions, and supplying said abort character to said third means for immediate transmission to said at least one second processing terminal.

21. A data communication system according to claim 20, wherein said seventh means includes means for generating a unique group of signals as an abort character to be supplied to said third means for transmission while inhibiting the selective signal modification by said eighth means.

* * * * *

UNITED STATES PATENT AND TRADEMARK OFFICE
CERTIFICATE OF CORRECTION

PATENT NO. : 4,168,469
DATED : September 18, 1979
INVENTOR(S) : Bipin D. Parikh, et al.

It is certified that error appears in the above–identified patent and that said Letters Patent are hereby corrected as shown below:

Column 28,
    Lines 64,65,66,67, delete "a sequence of address, control, and data signal groups, a prescribed functional signal group, and a terminating flag signal group".

Column 30,
    Line 2, delete "secured" and insert -- second --.

Line 58, delete "the".

Signed and Sealed this

Twenty-second Day of April 1980

[SEAL]

Attest:

Attesting Officer

SIDNEY A. DIAMOND

Commissioner of Patents and Trademarks